(12) United States Patent
Tang et al.

(10) Patent No.: US 8,859,359 B2
(45) Date of Patent: Oct. 14, 2014

(54) FLOATING BODY CELL STRUCTURES, DEVICES INCLUDING SAME, AND METHODS FOR FORMING SAME

(71) Applicant: Micron Technology, Inc., Boise, ID (US)

(72) Inventors: Sanh D. Tang, Boise, ID (US); John K. Zahurak, Eagle, ID (US); Werner Juengling, Saratoga Springs, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/953,450

(22) Filed: Jul. 29, 2013

(65) Prior Publication Data

US 2013/0309820 A1   Nov. 21, 2013

Related U.S. Application Data

(60) Continuation of application No. 13/609,997, filed on Sep. 11, 2012, now Pat. No. 8,530,295, which is a division of application No. 12/715,843, filed on Mar. 2, 2010, now Pat. No. 8,513,722.

(51) Int. Cl.
| | |
|---|---|
| *H01L 21/8238* | (2006.01) |
| *H01L 21/84* | (2006.01) |
| *H01L 29/78* | (2006.01) |
| *H01L 29/423* | (2006.01) |
| *H01L 27/12* | (2006.01) |
| *H01L 27/108* | (2006.01) |

(52) U.S. Cl.
CPC ........ *H01L 27/10802* (2013.01); *H01L 21/845* (2013.01); *H01L 29/7841* (2013.01); *H01L 27/10826* (2013.01); *H01L 27/10879* (2013.01); *H01L 29/4236* (2013.01); *H01L 27/1211* (2013.01)

USPC .................... 438/199; 438/300; 257/E21.632

(58) Field of Classification Search
USPC ......... 438/149, 197, 199, 266, 283, 300, 301, 438/587; 257/E21.632
See application file for complete search history.

(56) References Cited

U.S. PATENT DOCUMENTS

| | | |
|---|---|---|
| 3,988,771 A | 10/1976 | Krishna |
| 5,102,821 A | 4/1992 | Moslehi |

(Continued)

FOREIGN PATENT DOCUMENTS

| | | |
|---|---|---|
| JP | H02-275663 | 11/1990 |
| JP | H04-64249 | 2/1992 |

(Continued)

OTHER PUBLICATIONS

U.S. Appl. No. 12/410,207, filed Mar. 24, 2009, Tang et al.

(Continued)

*Primary Examiner* — Hoai V Pham
(74) *Attorney, Agent, or Firm* — Wells St. John, P.S.

(57) ABSTRACT

Floating body cell structures including an array of floating body cells disposed on a back gate and source regions and drain regions of the floating body cells spaced apart from the back gate. The floating body cells may each include a volume of semiconductive material having a channel region extending between pillars, which may be separated by a void, such as a U-shaped trench. The floating body cells of the array may be electrically coupled to another gate, which may be disposed on sidewalls of the volume of semiconductive material or within the void therein. Methods of forming the floating body cell devices are also disclosed.

23 Claims, 15 Drawing Sheets

(56) References Cited

U.S. PATENT DOCUMENTS

| | | |
|---|---|---|
| 5,106,776 A | 4/1992 | Shen et al. |
| 5,260,233 A | 11/1993 | Buti et al. |
| 5,412,598 A | 5/1995 | Shulman |
| 5,465,249 A | 11/1995 | Cooper, Jr. et al. |
| 5,510,630 A | 4/1996 | Agarwal et al. |
| 5,563,084 A | 10/1996 | Ramm et al. |
| 5,904,507 A | 5/1999 | Thomas |
| 5,909,618 A | 6/1999 | Forbes et al. |
| 5,936,274 A | 8/1999 | Forbes et al. |
| 5,963,469 A | 10/1999 | Forbes |
| 6,017,778 A | 1/2000 | Pezzani |
| 6,033,957 A | 3/2000 | Burns, Jr. et al. |
| 6,137,128 A | 10/2000 | Holmes et al. |
| 6,191,476 B1 | 2/2001 | Takahashi et al. |
| 6,225,151 B1 | 5/2001 | Gardner et al. |
| 6,225,165 B1 | 5/2001 | Noble, Jr. et al. |
| 6,229,161 B1 | 5/2001 | Nemati et al. |
| 6,255,731 B1 | 7/2001 | Ohmi et al. |
| 6,294,418 B1 * | 9/2001 | Noble .......................... 438/212 |
| 6,303,468 B1 | 10/2001 | Aspar et al. |
| 6,335,231 B1 | 1/2002 | Yamazaki et al. |
| 6,335,258 B1 | 1/2002 | Aspar et al. |
| 6,352,894 B1 | 3/2002 | Goebel et al. |
| 6,355,501 B1 | 3/2002 | Fung et al. |
| 6,355,520 B1 | 3/2002 | Park et al. |
| 6,365,488 B1 | 4/2002 | Liao |
| 6,492,662 B2 | 12/2002 | Hsu et al. |
| 6,559,471 B2 | 5/2003 | Finder et al. |
| 6,600,173 B2 | 7/2003 | Tiwari |
| 6,627,924 B2 | 9/2003 | Hsu et al. |
| 6,690,039 B1 | 2/2004 | Nemati et al. |
| 6,713,791 B2 | 3/2004 | Hsu et al. |
| 6,744,094 B2 | 6/2004 | Forbes |
| 6,756,286 B1 | 6/2004 | Moriceau et al. |
| 6,809,044 B1 | 10/2004 | Aspar et al. |
| 6,812,504 B2 | 11/2004 | Bhattacharyya |
| 6,815,781 B2 | 11/2004 | Vyvoda et al. |
| 6,841,813 B2 | 1/2005 | Walker et al. |
| 6,870,202 B2 | 3/2005 | Oka |
| 6,881,994 B2 | 4/2005 | Lee et al. |
| 6,882,008 B1 | 4/2005 | Ohsawa |
| 6,888,199 B2 | 5/2005 | Nowak et al. |
| 6,891,205 B1 | 5/2005 | Cho et al. |
| 6,906,354 B2 | 6/2005 | Hsu et al. |
| 6,934,209 B2 | 8/2005 | Marr |
| 6,940,748 B2 | 9/2005 | Nejad et al. |
| 6,940,761 B2 | 9/2005 | Forbes |
| 6,946,365 B2 | 9/2005 | Aspar et al. |
| 6,953,953 B1 | 10/2005 | Horch |
| 6,965,129 B1 | 11/2005 | Horch et al. |
| 6,992,349 B2 | 1/2006 | Lee et al. |
| 6,995,456 B2 | 2/2006 | Nowak |
| 7,029,956 B2 | 4/2006 | Hsu et al. |
| 7,052,941 B2 | 5/2006 | Lee |
| 7,075,146 B2 | 7/2006 | Forbes |
| 7,081,663 B2 | 7/2006 | Bulucea |
| 7,115,939 B2 | 10/2006 | Forbes |
| 7,120,046 B1 | 10/2006 | Forbes |
| 7,151,024 B1 | 12/2006 | Forbes |
| 7,157,771 B2 | 1/2007 | Forbes |
| RE39,484 E | 2/2007 | Bruel |
| 7,180,135 B1 | 2/2007 | Ionannou |
| 7,195,959 B1 | 3/2007 | Plummer et al. |
| 7,250,646 B2 | 7/2007 | Walker et al. |
| 7,268,373 B1 | 9/2007 | Gupta et al. |
| 7,271,052 B1 | 9/2007 | Forbes |
| 7,279,740 B2 | 10/2007 | Bhattacharyya et al. |
| 7,304,327 B1 | 12/2007 | Nemati et al. |
| 7,323,380 B2 | 1/2008 | Forbes |
| 7,326,969 B1 | 2/2008 | Horch |
| 7,338,862 B2 | 3/2008 | Huo et al. |
| 7,358,120 B2 | 4/2008 | Furukawa et al. |
| 7,359,229 B2 | 4/2008 | Ferrant et al. |
| 7,362,609 B2 | 4/2008 | Harrison et al. |
| 7,368,352 B2 | 5/2008 | Kim et al. |
| 7,378,325 B2 | 5/2008 | Kaneko |
| 7,410,867 B2 | 8/2008 | Forbes |
| 7,415,690 B2 | 8/2008 | Liang et al. |
| 7,440,310 B2 | 10/2008 | Bhattacharyya |
| 7,456,439 B1 | 11/2008 | Horch |
| 7,476,939 B2 | 1/2009 | Okhonin et al. |
| 7,488,627 B1 | 2/2009 | Nemati et al. |
| 7,491,608 B2 | 2/2009 | Forbes |
| 7,518,182 B2 | 4/2009 | Abbott et al. |
| 7,525,137 B2 | 4/2009 | Walker et al. |
| 7,538,000 B2 | 5/2009 | Dao |
| 7,579,240 B2 | 8/2009 | Forbes |
| 7,589,995 B2 | 9/2009 | Tang et al. |
| 7,592,209 B2 | 9/2009 | Chang |
| 7,615,436 B2 | 11/2009 | Kouznetsov et al. |
| 7,619,917 B2 | 11/2009 | Nirschl et al. |
| 7,629,651 B2 | 12/2009 | Nakajima |
| 7,663,188 B2 | 2/2010 | Chung |
| 7,786,505 B1 | 8/2010 | Yang et al. |
| 7,825,455 B2 | 11/2010 | Lee et al. |
| 7,838,360 B2 | 11/2010 | Forbes |
| 7,897,440 B1 | 3/2011 | Horch |
| 7,929,343 B2 | 4/2011 | Tang |
| 8,018,058 B2 | 9/2011 | Lee |
| 8,084,316 B2 | 12/2011 | Huo et al. |
| 8,102,025 B2 | 1/2012 | Ozeki et al. |
| 8,148,780 B2 | 4/2012 | Tang et al. |
| 8,501,559 B2 | 8/2013 | Tang et al. |
| 8,501,581 B2 | 8/2013 | Tang et al. |
| 8,558,220 B2 | 10/2013 | Schricker et al. |
| 2001/0002062 A1 | 5/2001 | Noble, Jr. et al. |
| 2001/0024841 A1 | 9/2001 | Noble, Jr. et al. |
| 2002/0070454 A1 | 6/2002 | Yasukawa |
| 2002/0158254 A1 | 10/2002 | Hsu et al. |
| 2002/0163019 A1 | 11/2002 | Mohsen |
| 2004/0159853 A1 | 8/2004 | Nemati et al. |
| 2004/0214379 A1 | 10/2004 | Lee et al. |
| 2004/0262635 A1 | 12/2004 | Lee |
| 2005/0001232 A1 | 1/2005 | Bhattacharyya |
| 2005/0230356 A1 | 10/2005 | Empedocles et al. |
| 2006/0034116 A1 | 2/2006 | Lam et al. |
| 2006/0071074 A1 | 4/2006 | Konececki et al. |
| 2006/0099776 A1 | 5/2006 | Dupont |
| 2006/0124974 A1 | 6/2006 | Cabral et al. |
| 2006/0125011 A1 | 6/2006 | Chang |
| 2006/0197115 A1 | 9/2006 | Toda |
| 2006/0227601 A1 | 10/2006 | Bhattacharyya |
| 2007/0012945 A1 | 1/2007 | Sugizaki |
| 2007/0023805 A1 | 2/2007 | Wells et al. |
| 2007/0029607 A1 | 2/2007 | Kouznetzov |
| 2007/0045709 A1 | 3/2007 | Yang |
| 2007/0080385 A1 | 4/2007 | Kim et al. |
| 2007/0127289 A1 | 6/2007 | Lee |
| 2007/0215954 A1 | 9/2007 | Mouli |
| 2007/0252175 A1 | 11/2007 | Tang et al. |
| 2007/0264771 A1 | 11/2007 | Anathan et al. |
| 2008/0124867 A1 | 5/2008 | Brown |
| 2008/0128802 A1 | 6/2008 | Huo et al. |
| 2008/0211023 A1 | 9/2008 | Shino |
| 2008/0233694 A1 | 9/2008 | Li |
| 2008/0237776 A1 | 10/2008 | Abbott |
| 2008/0299753 A1 | 12/2008 | Figura et al. |
| 2009/0003025 A1 | 1/2009 | Makhleshi et al. |
| 2009/0010056 A1 | 1/2009 | Kuo et al. |
| 2009/0014813 A1 | 1/2009 | Chao et al. |
| 2009/0022003 A1 | 1/2009 | Song et al. |
| 2009/0026522 A1 | 1/2009 | Anathan |
| 2009/0072341 A1 | 3/2009 | Liu et al. |
| 2009/0079030 A1 | 3/2009 | Cheng et al. |
| 2009/0108351 A1 | 4/2009 | Yang et al. |
| 2009/0140290 A1 | 6/2009 | Schulze et al. |
| 2009/0170261 A1 | 7/2009 | Lee |
| 2009/0173984 A1 | 7/2009 | Wang |
| 2009/0189228 A1 | 7/2009 | Zhang et al. |
| 2009/0200536 A1 | 8/2009 | Van Schaijk et al. |
| 2009/0201723 A1 | 8/2009 | Okhonin et al. |
| 2009/0207681 A1 | 8/2009 | Juengling |
| 2009/0213648 A1 | 8/2009 | Slesazeck |
| 2009/0218656 A1 | 9/2009 | Gonzalez et al. |

(56) References Cited

U.S. PATENT DOCUMENTS

| | | |
|---|---|---|
| 2009/0242865 A1 | 10/2009 | Lung et al. |
| 2010/0006938 A1 | 1/2010 | Jang |
| 2010/0008139 A1 | 1/2010 | Bae |
| 2010/0061145 A1 | 3/2010 | Weis |
| 2010/0200916 A1 | 8/2010 | Gossner et al. |
| 2010/0207180 A1 | 8/2010 | Lee |
| 2010/0277982 A1 | 11/2010 | Okhonin |
| 2011/0024791 A1 | 2/2011 | Schulze et al. |
| 2011/0156044 A1 | 6/2011 | Lee et al. |
| 2011/0215371 A1 | 9/2011 | Tang et al. |
| 2011/0215407 A1 | 9/2011 | Tang et al. |
| 2011/0215408 A1 | 9/2011 | Tang et al. |
| 2011/0215436 A1 | 9/2011 | Tang et al. |
| 2011/8021539 | 9/2011 | Tang et al. |
| 2012/0223369 A1 | 9/2012 | Gupta et al. |
| 2012/0223380 A1 | 9/2012 | Lee et al. |

FOREIGN PATENT DOCUMENTS

| | | |
|---|---|---|
| JP | H04-186815 | 7/1992 |
| JP | H04-283914 | 10/1992 |
| JP | 06-104446 | 4/1994 |
| JP | H08-088153 | 4/1996 |
| JP | H10-150176 | 6/1998 |
| JP | H11-103035 | 4/1999 |
| JP | 2000-150905 | 5/2000 |
| JP | 2003-030980 | 1/2003 |
| JP | 2004-03398 | 10/2004 |
| JP | 2005-136191 | 5/2005 |
| JP | 2005-327766 | 11/2005 |
| JP | 2007-511895 | 5/2007 |
| JP | 2008-010503 | 1/2008 |
| JP | 2009-531860 | 9/2009 |
| JP | 2011-508979 | 3/2011 |
| KR | 10-0663359 | 10/2006 |
| KR | 10-0702014 | 11/2006 |
| KR | 10-0821456 | 4/2008 |
| KR | 2009-0040460 | 4/2009 |
| KR | 2009-0054245 | 5/2009 |
| KR | 10-2010-0070835 | 6/2010 |
| TW | 200802866 | 1/2008 |
| TW | 101104088 | 12/2013 |
| TW | 100106777 | 2/2014 |
| WO | WO 2009/088889 | 7/2009 |
| WO | PCT/US2011/024354 | 9/2011 |
| WO | PCT/US2011/024376 | 9/2011 |
| WO | PCT/US2011/024387 | 9/2011 |
| WO | PCT/US2012/021438 | 8/2012 |
| WO | PCT/US2011/024354 | 9/2012 |
| WO | PCT/US2011/024376 | 9/2012 |
| WO | PCT/US2011/024387 | 9/2012 |
| WO | PCT/US2012/025109 | 9/2012 |
| WO | PCT/US2012/025115 | 10/2012 |
| WO | PCT/US2012/021438 | 8/2013 |
| WO | PCT/US2012/025109 | 9/2013 |
| WO | PCT/US2012/025115 | 9/2013 |

OTHER PUBLICATIONS

U.S. Appl. No. 12/419,658, filed Apr. 7, 2009, Tang et al.
U.S. Appl. No. 12/715,704, filed Apr. 14, 2011, Tang et al.
U.S. Appl. No. 12/715,743, filed Mar. 2, 2010, Tang et al.
U.S. Appl. No. 12/715,889, filed Mar. 2, 2010, Tang et al.
U.S. Appl. No. 12/715,922, filed Mar. 2, 2010, Tang et al.
U.S. Appl. No. 12/715,843, filed Mar. 2, 2010, Tang et al.
Cho et al., A Novel Capacitor-Less DRAM Cell Using Thin Capacitively-Coupled Thyristor (TCCT), IEEE, 2005, 4 pages.
Nemati et al., A Novel High Density, Low Voltage SRAM Cell with a Vertical NDR Device, IEEE, 1998, 2 pages.
Sasago et al., "Cross-point phase change memory with 4F2 cell size driven by low-contact-resistivity poly-Si diode", Symposium on VLSI Technology Digest of Technical Papers, 2009, pp. 24-25.
Sugizaki et al., "35-nm Gate-Length and Ultra Low-voltage (0.45 V) Operation Bulk Thyristor-SRAM/DRAM (BT-RAM) Cell with Triple Selective Epitaxy Layers (TELs)", Symposium on VLSI Technology Digest of Technical Papers, 2008.
Suliman et al., Gate-Oxide Grown on the Sidewalls and Base of aU-Shaped Si Trench: Effects of the Oxide and Oxide/Si Interface Condition on the Properties of Vertical MOS Devices, Microelectronic Engineering, vol. 72, pp. 247-252; 2004.
Yang et al., High Performance CMOS Fabricated on Hybrid Substrate with Different Crystal Orientations, IEEE, 2003, 4 pages.
Yu et al., Low-Temperature Titanium-Based Wafer Bonding, Journal of the Electrocheical Society, vol. 154,No. 1, 2007, pp. H20-H25.
Cheong et al., "Investigation of Ultralow Leakage in MOS Capacitors on4H SiC", IEEE Transactions on Electron Devices, vol. 51(9), Sep. 2004, pp. 1361-1365.
Dimitraiadis etal., "New a-SiC, Optically Controlled, Thyristor-Like Switch", Electronics Letters, vol. 28)17), Aug. 13, 1992, pp. 1622-1624.
Jen et al., "Electrical and Luminescent Characteristics of a-SiC:H P-I-:" Thin-Film LED's with Graded-Gap Junctions, IEEE Transactions on Electron Devices, vol. 44(4), Apr. 1997, pp. 565-571.
Powell et al., "SiC Materials-Progress, Status, and Potential Roadblocks", Proceedings of the IEEE, vol. 90(6), Jun. 2002, pp. 942-955.
Xie et al., "A Veritically Integrated Bipolar Storage Cell in 6H Silicon Carbide for Nonvolatile Memory Applications", IEEE Electron Device Letters, vol. 15(6), Jun. 1994, pp. 212-214.
Burke et al., "Silicon Carbide Thyristors for Power Applications", Pulsed Power Conference 1995, Digest of Technical Papers, 10th IEEE International vol. 1, United States, Jul. 3-6, 1995; pp. 327-335.

\* cited by examiner

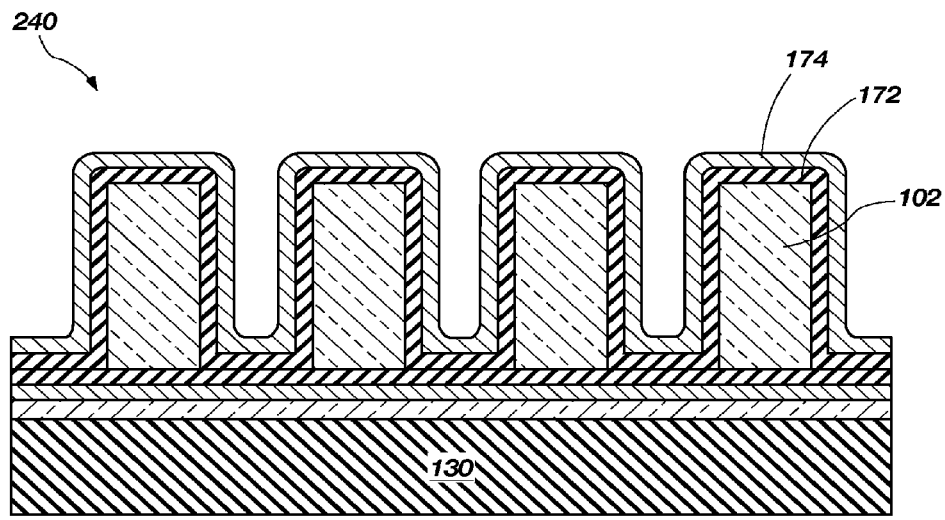
FIG. 17A1
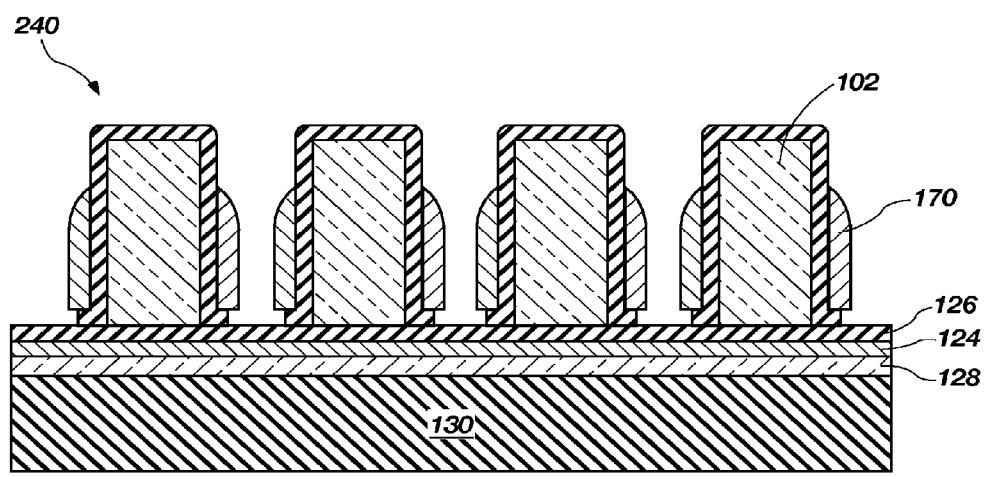
FIG. 17A2

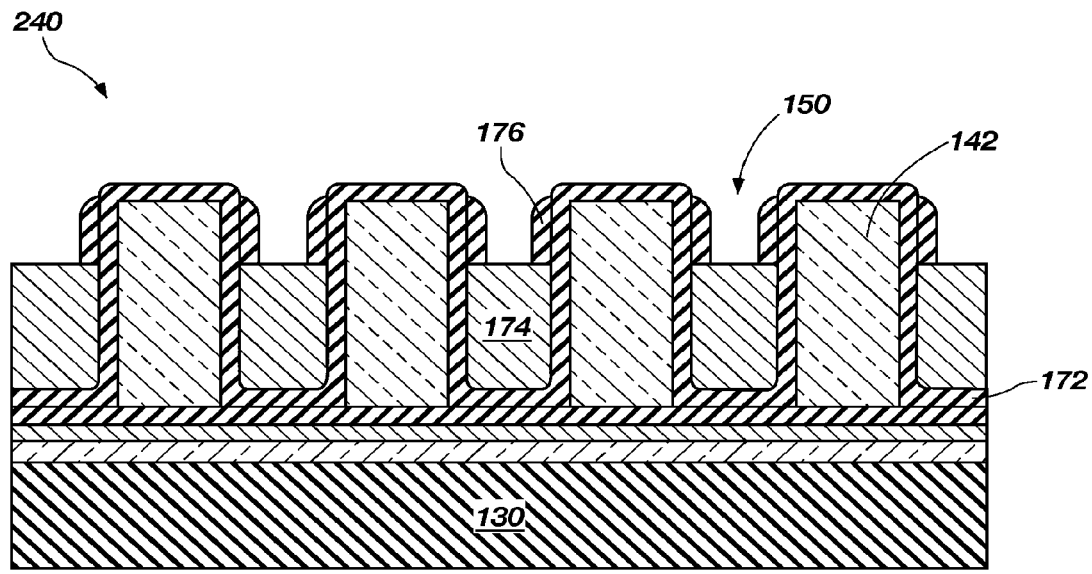
FIG. 17B1
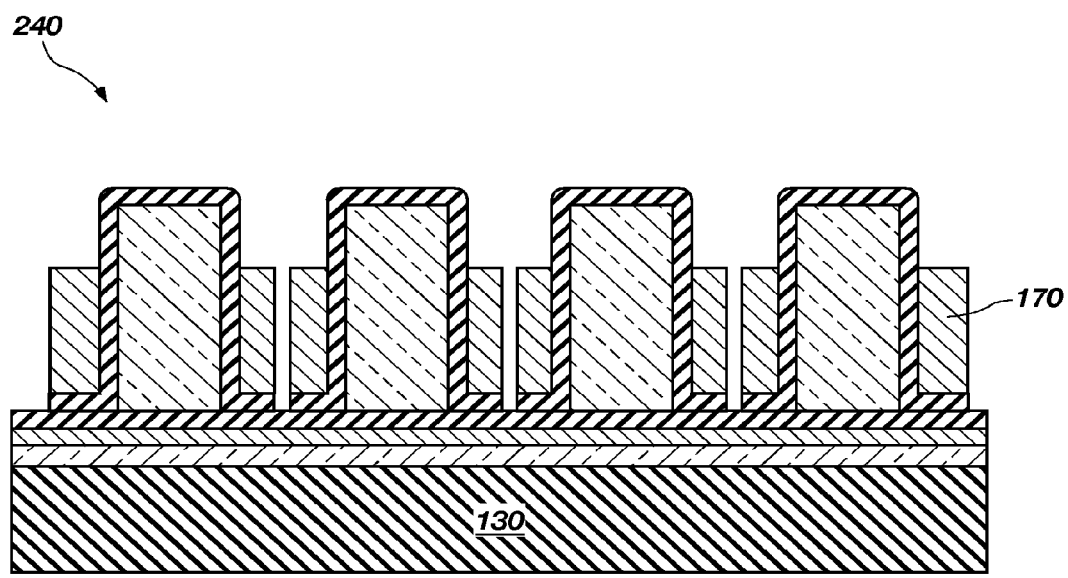
FIG. 17B2

FLOATING BODY CELL STRUCTURES, DEVICES INCLUDING SAME, AND METHODS FOR FORMING SAME

CROSS-REFERENCE TO RELATED APPLICATIONS

This patent resulted from continuation application of U.S. patent application Ser. No. 13/609,997, filed Sep. 11, 2012, entitled "Floating Body Cell Structures, Devices Including Same, and Methods for Forming Same", naming Sanh D. Tanh, John K. Zahurak, and Werner Juengling as inventors, which is a divisional application of U.S. patent application Ser. No. 12/715,843, filed Mar. 2, 2010, entitled "Floating Body Cell Structures, Devices Including Same, and Methods for Forming Same", naming Sanh D. Tanh, John K. Zahurak, and Werner Juengling as inventors, which is related to co-pending U.S. patent application Ser. No. 12/715,704 filed on Mar. 2, 2010, and titled "SEMICONDUCTOR-METAL-ON-INSULATOR STRUCTURES, METHODS OF FORMING SUCH STRUCTURES, AND SEMICONDUCTOR DEVICES INCLUDING SUCH STRUCTURES"; co-pending U.S. patent application Ser. No. 12/715,743 filed on Mar. 2, 2010, and titled "SEMICONDUCTOR DEVICES INCLUDING A DIODE STRUCTURE OVER A CONDUCTIVE STRAP, AND METHODS OF FORMING SUCH SEMICONDUCTOR DEVICES"; co-pending U.S. patent application Ser. No. 12/715,889 filed on Mar. 2, 2010, and titled "THYRISTOR-BASED MEMORY CELLS, DEVICES AND SYSTEMS INCLUDING THE SAME AND METHODS FOR FORMING THE SAME"; and co-pending U.S. patent application Ser. No. 12/715,922 filed on Mar. 2, 2010, and titled "SEMICONDUCTOR CELLS, ARRAYS, DEVICES AND SYSTEMS HAVING A BURIED CONDUCTIVE LINE AND METHODS FOR FORMING THE SAME", the disclosures of which is are incorporated herein by reference.

TECHNICAL FIELD

Embodiments of the present invention relate to methods, structures, and devices for increasing memory density and, more specifically, to devices comprising multi-gate floating body cell structures, devices including such structures, and methods for forming such devices.

BACKGROUND

A dynamic random access memory (DRAM) cell, including a transistor and a capacitor, has a small cell size and a high operation speed. However, capacitor integration and scaling hamper reduction of DRAM cell area. For each DRAM memory generation, a constant capacitance value is targeted and requires a complicated stack or a deep-trench capacitor that leads to additional process steps and lessens compatibility with conventional, complementary metal oxide semiconductor (CMOS) structures.

In order to solve scaling problems, an alternative solution has been proposed where the conventional storage capacitor is replaced by a thin-film body of a silicon-on-insulator (SOI) metal-oxide-semiconductor field-effect-transistor (MOSFET). The memory storage mechanism for such a structure is based on the threshold voltage shift produced by majority carrier excess (accumulation) or deficit (depletion) in a floating-body. The cell utilizes the floating-body effect to store charge under the channel of an SOI transistor, which changes the transistor's threshold voltage, as a storage element. Since there is no body contact to instantly adjust a majority charge carrier concentration, equilibrium is established only after a relatively "long" period of time, which renders SOI memories attractive in terms of retention and refresh time.

As floating body cell size becomes smaller, the volume of the floating body decreases and the area between the source and the drain becomes closer, less charge is stored in the floating body resulting in charge loss being swept out by a forward bias effect caused by Shockley-Read Hall (SRH) recombination. Such charge loss may result in a decrease or loss of charge retention in the cell. In order to prevent this phenomenon in the conventional construction, the thickness of the SOI substrate is reduced as the cell size becomes smaller. However, as the thickness of the SOI substrate is reduced, the amount of charge accumulated in the floating body is decreased and the cell may be more susceptible to noise during operation. That is, the floating body effect is decreased, reducing the operating margin of the device.

There is a need for methods, structures and devices for increasing density and reliability in floating body transistors.

BRIEF DESCRIPTION OF THE SEVERAL VIEWS OF THE DRAWINGS

FIGS. 16-19 illustrate cross-sectional and perspective views of a portion of a floating body cell structure during various stages of fabrication in accordance with the embodiment of the present disclosure illustrated in FIG. 15;

DETAILED DESCRIPTION

Figure 1:
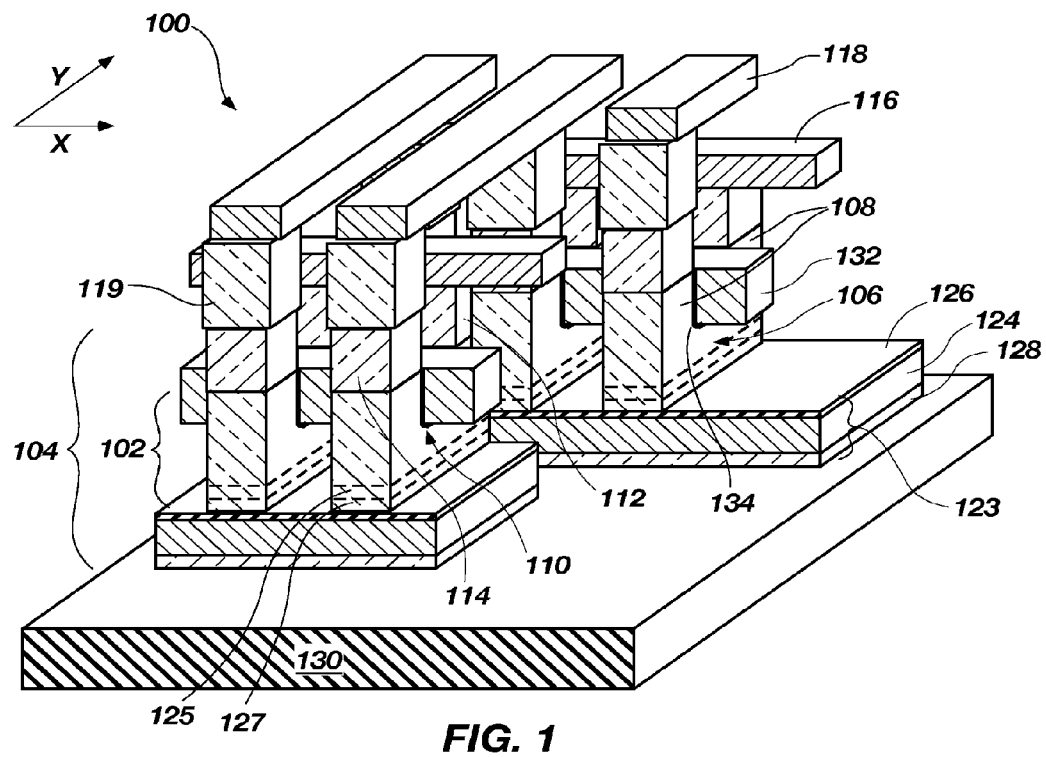
FIGS. 1-3 illustrate perspective views of a portion of a floating body cell device in accordance with embodiments of the present disclosure.

A multi-gate floating body cell structure, a device including such a structure and methods for forming such a structure are disclosed. Such structures include, for example, at least one floating body cell disposed on a back gate and another gate associated with the at least one floating body cell. The another gate may be disposed within the at least one floating body or on sidewalls thereof. The structures and devices may be used in numerous semiconductor devices, such as, dynamic random access memory (DRAM), zero capacitor random access memory (Z-RAM), and embedded dynamic random access memory (eDRAM). The structures and devices may further be used in a system such as, central processing units (CPUs), a system-on-a-chip (SOC), sensors, imagers, micro electro-mechanical systems (MEMS) and nano electro-mechanical systems (NEMS). Methods of forming such structures include forming a base comprising a semiconductive material, a dielectric material, a gate material, and an amorphous silicon material overlying a wafer, removing a portion of the semiconductive material to form a plurality of floating bodies protruding from a surface of the base material, removing another portion of the semiconductive material to form a void in each of the plurality of floating bodies, exposing the plurality of floating bodies to at least one dopant to form a source region and a drain region in upper regions of each of the plurality of floating bodies and forming a gate associated with at least one of the plurality of floating bodies.

The structures formed in accordance with the various embodiments of the present disclosure include a plurality of floating body cells, each of which is disposed on a back gate and is associated with another gate. Each of the floating body cells of the plurality may include a source region and drain region spaced apart from the back gate by a volume of semiconductive material and a channel coupled by the back gate. The volume of semiconductive material between the back gate electrode and each of the source region and the drain region may substantially increase charge storage within the floating body cells, minimizing signal fluctuation. Additionally, the back gate may function as a capacitor in the device and, thus, provides longer retention time and increased memory density by reducing the area required by the device. The back gate may be formed as a local back gate, each of which may be independently biased, or as a global back gate. For example, a local back gate may be desired for programming and cell operation purposes. As configured, charge is stored at the bottom of the floating body cell near the back gate and is, thus, isolated from the source region and the drain region. Accordingly, charge loss during operation is minimized providing longer retention, improved reliability and decreased disturbance.

The structures and devices formed in accordance with various embodiments of the present disclosure may be stacked with a variety of memory devices, such as a complementary metal-oxide semiconductor (CMOS) device. Integrating the structures and devices formed in accordance with various embodiments of the present disclosure may reduce the cell size and provide increased cache memory density.

The following description provides specific details, such as material types and processing conditions, in order to provide a thorough description of embodiments of the present disclosure and implementation thereof. However, a person of ordinary skill in the art will understand that the embodiments of the present disclosure may be practiced without employing these specific details and in conjunction with conventional fabrication techniques. In addition, the description provided herein does not form a complete process flow for manufacturing a semiconductor device including the floating body cell structure. Only those process acts and structures necessary to understand the embodiments of the present invention are described in detail herein. Additional acts to form a complete semiconductor device including the floating body cell structure according to an embodiment of the invention may be performed by conventional techniques.

The materials described herein may be formed by any suitable technique including, but not limited to, spin coating, blanket coating, chemical vapor deposition ("CVD"), plasma enhanced chemical vapor deposition ("PECVD"), atomic layer deposition ("ALD"), plasma enhanced ALD, or physical vapor deposition ("PVD"). Alternatively, materials may be grown in situ. A technique suitable for depositing or growing a particular material may be selected by a person of ordinary skill in the art. While the materials described and illustrated herein may be formed as layers, the materials are not limited thereto and may be formed in other three-dimensional configurations.

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular system, logic device, memory cell, or floating body cell structure, but are merely idealized representations that are employed to describe the embodiments of the present invention. The drawings presented herein are not necessarily drawn to scale. Additionally, elements common between drawings may retain the same numerical designation.

Figure 2:
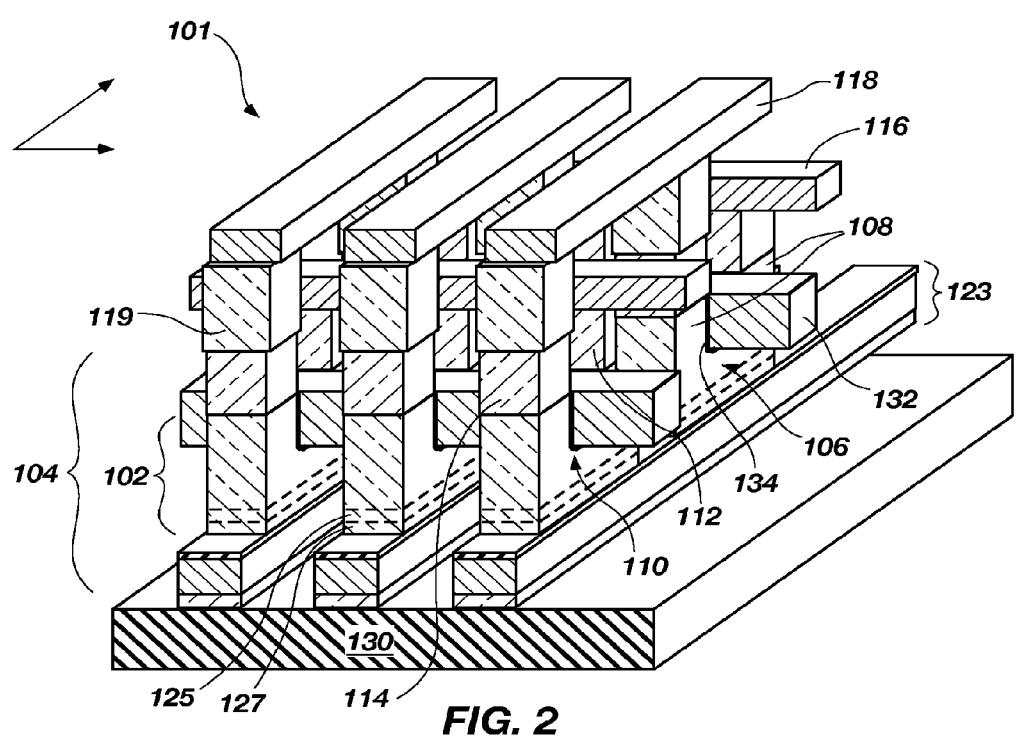
Figure 3:
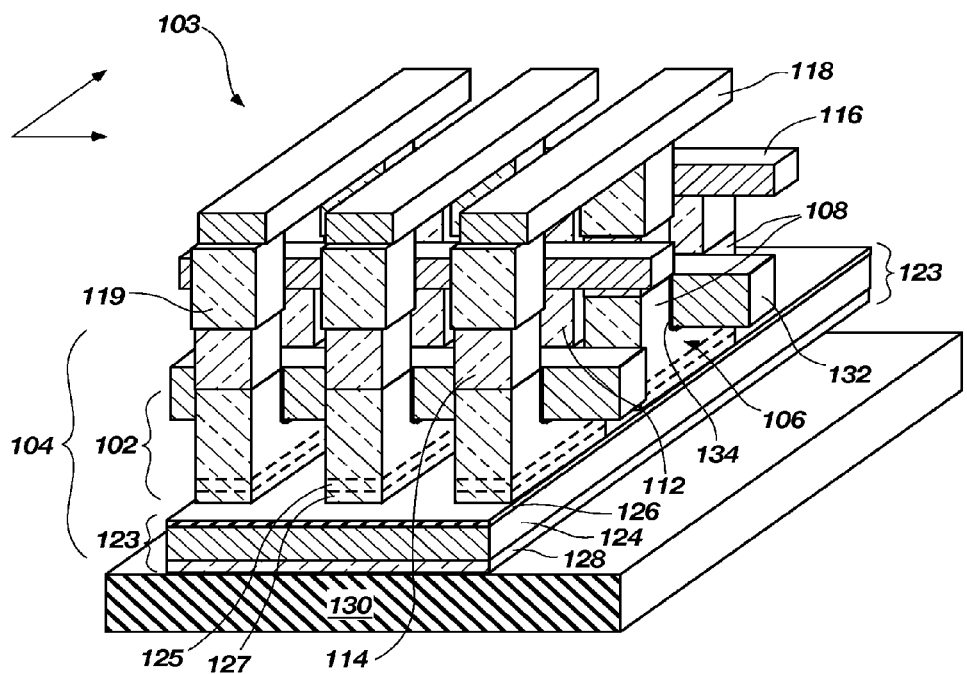

FIGS. 1-3 are perspective views illustrating embodiments of floating body cell structures 100, 101 and 103 that include an array of floating body cells 104, the details of forming such are described in detail below. In some embodiments, the floating body cell structure 100 may be used to form a vertical multi-gate floating body cell device. Each floating body cell 104 in the array may include a volume of semiconductive material 102. The volume of semiconductor material 102 may include pillars 108 defining a void 110, such as a u-shaped trench. An upper portion of the pillars 108 of each volume of semiconductive material 102 may be doped differently than remaining portions thereof to form a source region 112 and a drain region 114. By way of non-limiting example, the source region 112 and the drain region 114 may be doped with an n-type material, and the remaining portions of the volume of semiconductive material 102 may be doped with a p-type material. The source region 112 and drain region 114 may, respectively, be electrically coupled to an access line, such as common source line 116 and a data/sense line, such as bit line 118, as will be described in further detail. By way of non-limiting example, a contact plug 119 may be disposed between at least one of the source region 112 and the drain region 114 and the associated common source line 116 or bit line 118. Although the contact plug 119 is shown in FIG. 1 as being disposed between the drain regions 114 and the bit lines 118, the contact plug 119 may additionally, or alternatively, be disposed between the source regions 112 and the common source lines 116.

As a non-limiting example, each of the floating body cells 104 may be aligned with one another in an array that includes a plurality of rows extending in a first direction X and a plurality of columns extending in a second direction Y. The floating body cell structures 100, 101 and 103 shown in FIGS. 1-3 each include two (2) rows and three (3) columns. However, as configured, the floating body cell structures 100, 101 and 103 may include any number of rows and columns. Additionally, the rows of floating body cells 104 aligned in the first direction X may be substantially perpendicular the columns of floating body cells 104 aligned in the second direction Y.

The floating body cells 104 may be disposed on a back gate 123 that may include, for example, a dielectric material 126, a conductive material 124 and an amorphous silicon material 128. For ease of description, conductive material 124 will hereinafter be referred to as back gate electrode 124 and the dielectric material 126 will hereinafter be referred to as back gate dielectric 126. The floating body cells 104 may each be electrically coupled to the back gate 123. Optionally, each of the back gate electrodes 124 may include a metal 127 and a doped region 125. The back gate electrodes 124 may be formed from, for example, a titanium-rich titanium nitride material, such as metal mode titanium nitride (MMTiN), a tantalum nitride material or a tantalum silicide material. The back gate dielectric 126 and the metal 127 form a metal-insulator-metal (MIM) structure that may function as a capacitor in the floating body cell structures 100, 101 and 103. Increased capacitance may be obtained by optimizing at least one of the work function of the metal 127 and the dielectric constant (k-value) of the back gate dielectric 126, and the thicknesses of the back gate dielectric 126 and the metal 127. Increasing capacitance in this manner may provide increased retention times in the floating body structures 100, 101 and 103.

The back gate electrode 124 may overlie an amorphous silicon material 128 disposed on an electrically insulative material 130, which may be formed on, for example, a wafer (not shown). In some embodiments, the back gate 123 of each of the floating body cells 104 may be configured as a local back gate, having sidewalls continuous and aligned with those of the floating body cells 104, as shown in FIGS. 1 and 2. A single floating body cell 104 may be disposed on the back gate 123 or, optionally, multiple floating body cells 104 may be disposed on the back gate 123. The back gate 123 may be patterned as a plurality of local back gates that may be independently biased during operation of the cell or may be patterned as a global back gate. For example, as shown in FIG. 1, the back gate 123 may be a local back gate that extends in the first direction X along at least one of the rows and the plurality of floating body cells 104 aligned in that row may be disposed thereon. In other embodiments, as shown in FIG. 2, the back gate 123 may be a local back gate that extends in the second direction Y along at least one of the columns and the plurality of floating body cells 104 arranged in that column may be disposed thereon. As a non-limiting example, each of the back gates 123 may be aligned substantially parallel to an overlying one of the bit lines 118. In additional embodiments, as shown in FIG. 3, the back gate 123 of the floating body cell structure 100 may be a global back gate upon which the plurality of floating body cells 104, aligned in both the first direction X and the second direction Y, may be disposed.

A conductive element 132 may be disposed within the void 110 of each floating body cells 104. For the ease of description, the conductive element 132 is hereinafter referred to as buried gate electrode 132. Another dielectric material 134 may be disposed between the buried gate electrode 132 and the semiconductive material exposed within the void 110 in the floating body cell 104. For the ease of description, the dielectric material 134 is hereinafter referred to as buried gate dielectric 134. The buried gate dielectric 134 may, optionally, terminate below or at the respective interfaces between the channel region 106 of each of the floating body cells 104 and the source region 112 and the drain region 114 in the upper portions of the pillars 108. Electromagnetic fields emanating from the buried gate electrode 132 may establish a channel through the associated floating body cell 104, which enables a current to flow from the source region 112 to the drain region 114.

During use and operation of floating body cell 104, the majority carrier is stored at a location within the floating body cells 104 isolated from each of the buried gate electrode 132, the source region 112 and the drain region 114. As a result, charge retention and reliability may be enhanced compared to conventional floating body cell structures. As configured, a thickness of the volume of semiconductive material 102 may be varied to further distance the location of the stored charge from the buried gate electrode 132, the source region 112 and the drain region 114, as described in greater detail herein. Moreover, as configured, the volume of semiconductive material 102 may be formed to have a larger storage volume in comparison to a floating body of conventional structures. This enables increased charge storage within the floating body cell 104 and, therefore, may minimize signal fluctuation due to lost charge. As a result, floating body cell 104 may provide an enhanced signal, longer retention and increased reliability in comparison to conventional structures.

In some embodiments, the floating body cell structures 100, 101 and 103 may be superposed with and/or integrated with other memory elements (not shown), such as a CMOS device, to form a multi-level semiconductor structure. The floating body cell structures 100, 101 and 103 may be operably coupled to at least one memory device to form a system, such as a central processing unit (CPU) and a system-on-a-chip (SOC) or multiple tiers of the floating body cell structures 100, 101 and 103 may be vertically stacked over one another to increase density.

Figure 4:
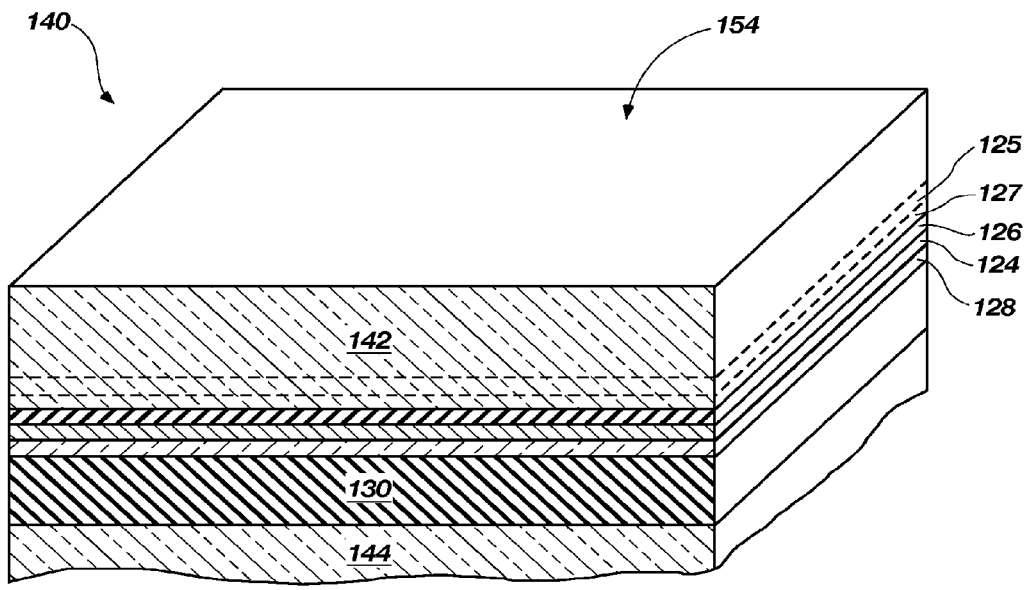
FIGS. 4-14 illustrate cross-sectional, perspective and top plan views of a portion of a floating body cell structure during various stages of fabrication in accordance with the embodiments of the present disclosure illustrated in FIGS. 1-3.

With reference to FIGS. 4-14, a method of forming floating body cell structures 100, 101 and 103 including a plurality of floating body cells 104, such as those shown in FIGS. 1-3, will now be described, wherein like elements are designated by like numerals. Referring to FIG. 4, a semiconductor structure 140 may be provided that includes a semiconductive material 142 overlying and contacting the back gate dielectric 126, the back gate dielectric 126 overlying and contacting the back gate contact 124, the back gate electrode 124 overlying and contacting the amorphous silicon material 128, and the amorphous silicon material 128 overlying and contacting the electrically insulative material 130. The semiconductor structure 140 may, optionally, include the doped region 125 and the metal 127, as shown in broken lines. In some embodiments, the electrically insulative material 130 may be formed over a handle wafer 144. As used herein, the term "wafer" means any structure that includes a semiconductor type material including, for example, silicon, germanium, gallium arsenide, indium phosphide, and other III-V or II-VI type semiconductive materials. Wafers include, for example, not only conventional wafers but also other bulk semiconductor substrates such as, by way of non-limiting example, silicon-on-insulator (SOI) type substrates, silicon-on-sapphire (SOS) type substrates, and epitaxial layers of silicon supported by another material. Furthermore, when reference is made to a "wafer" in the following description, previous process steps may have been utilized to at least partially form elements or components of a circuit or device in or over a surface of the wafer. In some embodiments, the electrically insulative material 130 may be disposed over memory elements (not shown), such as a complementary metal oxide semiconductor structure (CMOS) device, formed in or on the handle wafer 144. The electrically insulative material 130 may include, for example, a buried oxide (BOX) material.

The semiconductor structure 140 may be formed, for example, by transferring the amorphous silicon material 128, the back gate contact 124, the back gate dielectric 126 and the semiconductive material 142 to the electrically insulative material 130 overlying the handle wafer 144 by a process described herein using a modification of so-called SMART-CUT® layer transfer technology. Such processes are described in detail in, for example, U.S. Pat. No. RE 39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., U.S. Pat. No. 6,946,365 to Aspar et al., and U.S. Patent Application Publication No. 2006/0099776 to Dupont. However, other processes suitable for manufacturing the semiconductor substrate 140 may also be used. In conventional implementation of the SMART-CUT® layer transfer technology, donor wafers and acceptor wafers are bonded together using a high temperature anneal. The temperature used to bond the donor and acceptor wafers is from about 1000° C. to about 1300° C. However, due to the presence of the back gate contact 124, it may be advantageous to fabricate the semiconductor structure 140 at decreased temperatures to prevent thermal damage to the back gate contact 123. Accordingly, as described herein, the semiconductor structure 140 may be formed using substantially reduced temperatures in comparison to those required by conventional SMART-CUT® layer transfer technology.

Figure 5:
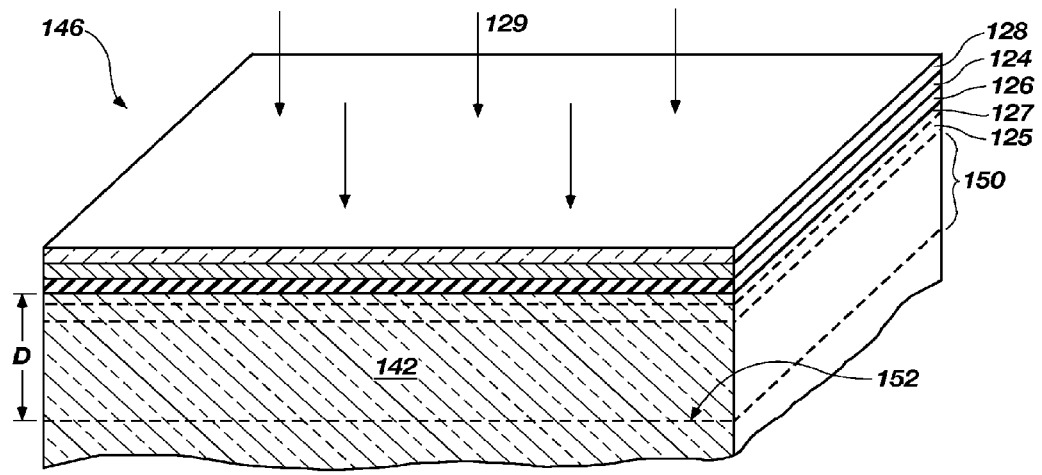

Referring to FIG. 5, a workpiece 146 may be formed by respectively depositing the back gate dielectric 126, the back gate electrode 124 and the amorphous silicon material 128 over the semiconductive material 142, which may comprise a portion of, for example, a donor wafer. Optionally, the workpiece 146 may include the metal 127 and the doped region 125. The doped region 125 may be formed using conventional methods, such as an ion implantation process or a high temperature diffusion process and may have a thickness between about 10 nm and about 50 nm. The metal 127, if present, may comprise a titanium nitride material, such as metal mode titanium nitride (MMTiN), a titanium silicide material, a tantalum nitride material or a tungsten silicide material. The metal 127 may be formed over and in contact with the doped region 125 using a CVD process, a PVD process, a sputtering process or a plating process and may have a thickness between about 10 nm to about 30 nm. The back gate dielectric 126 may include, for example, an oxide material, a high k dielectric material or a nitride material and may be formed over and in contact with the semiconductive material 142 or the metal 127, if present, using a CVD process or by decomposing tetraethyl orthosilicate (TEOS). As a non-limiting example, the back gate dielectric 126 may have a thickness of from about 20 Å to about 70 Å. The back gate electrode 124 may include a conductive material, such as a metal material. The conductive material may be titanium nitride material, a titanium silicide material, a tungsten silicide material or a tantalum nitride material and may be formed over and in contact with the back gate dielectric 126 using a CVD process, a PVD process, a sputtering process or a plating process. By way of non-limiting example, the back gate electrode 124 may have a thickness of from about 100 Å to about 600 Å. The amorphous silicon material 128 may be formed over and in contact with the back gate dielectric 126 using, for example, a PVD process or a CVD process. As a non-limiting example, the amorphous silicon material 128 may have a thickness of from about 100 Å to about 400 Å.

An atomic species may be implanted into the semiconductive material 142 to form a transfer region 150. The atomic species may be hydrogen ions, ions of rare gases, also termed inert or noble gases, or ions of fluorine. The atomic species may be implanted into the semiconductive material 142 to form an implanted zone 152, which is shown in the semiconductive material 142 in broken lines. The atomic species may be implanted into the semiconductive material 142 prior to formation of one or all of the back gate dielectric 126, the back gate electrode 124 and the amorphous silicon material 128 thereon or after formation of the back gate dielectric 126, the back gate electrode 124 and the amorphous silicon material 128 thereon. As known in the art, the depth at which the ions are implanted into the semiconductive material 142 is at least partially a function of the energy with which the ions are implanted into the semiconductive material 142. The implanted zone 152 may be formed at a desired depth in the semiconductive material 142, which is dependent on parameters, such as implant dose and energy of the atomic species, as known in the art. A depth D of the implanted zone 152 within the semiconductor structure 142 may correspond to a desired thickness and/or volume of the floating body cells 104 shown in FIGS. 1-3. The volume of the floating bodies 102 and the amount of charge that may be stored therein may be increased by increasing the depth D and, thus, the thickness of the semiconductive material 142. Furthermore, by increasing the thickness of the floating body cells 104, the charge stored therein may be further isolated from conductive elements of the floating body cell structures 100, 101 and 103 (i.e., the buried gate electrode 132, the source regions 112 and drain regions 114). By isolating the stored charge from the conductive elements, charge loss may be decreased and, thus, the floating body cells 104 may provide increased retention and improved reliability. As a non-limiting example, the atomic species may be implanted into the semiconductive material 142 with an energy selected to form the implanted zone 152 at a depth D of between about 100 nm and about 350 nm (about 1000 Å to about 3500 Å).

The implanted zone 152 includes a layer of microbubbles or microcavities comprising the implanted ion species, and provides a weakened structure within the semiconductive material 142. The semiconductive material 142 may then be thermally treated at a temperature above that at which implantation is effected to effect crystalline rearrangement in the wafer and coalescence of the microbubbles or microcavities. Optionally, the attachment surface (not shown) may be formed by exposing the major surface of the amorphous silicon material 128 of the semiconductive material 142 to a reactive ion etching (RIE) plasma including an inert gas (e.g., argon, oxygen, or nitrogen) to form a plasma-activated material, or by exposing the surface to a dilute ammonia hydroxide or hydrogen fluoride solution. Forming an attachment surface on the amorphous silicon material 128 may increase the kinetics of a subsequent bonding act with the electrically insulative material 130 overlying the handle wafer 144, due to the increased mobility of the ionic species (e.g., hydrogen).

Figure 6:
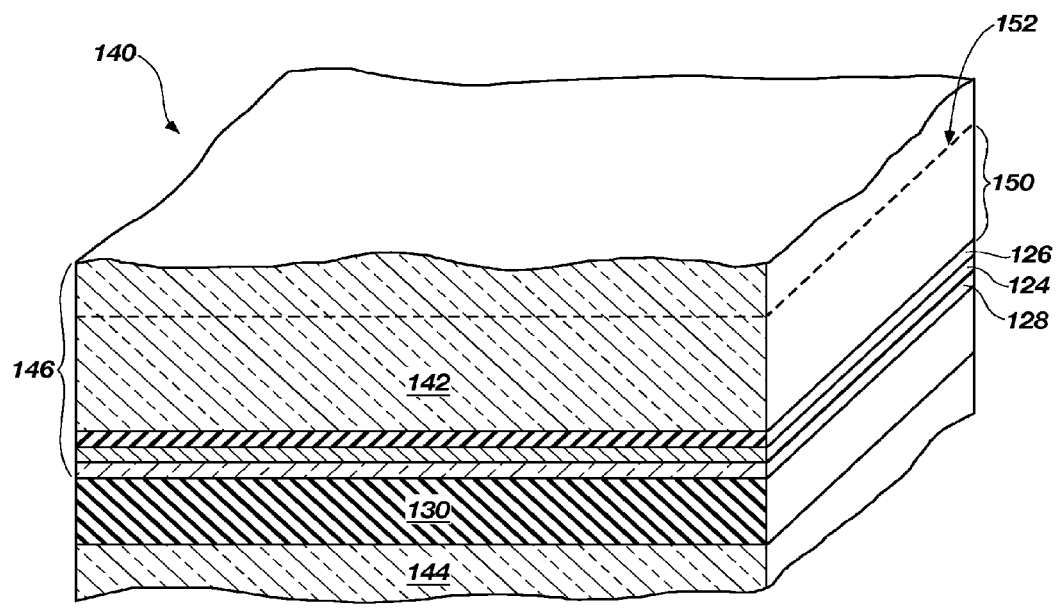

As shown in FIG. 6, the workpiece 146 may be superposed on the electrically insulative material 130 overlying the handle wafer 144 so that the electrically insulative material 130 is in contact with the amorphous silicon material 128 of the workpiece 146. The amorphous silicon material 128 of the workpiece 146 may be bonded to the electrically insulative material 130. By way of non-limiting example, the amorphous silicon material 128 and the electrically insulative material 130 may also be bonded without heat at ambient temperature (from about 20° C. to about 25° C.). Pressure may also be applied to at least one of the workpiece 146 and the handle wafer 144 to bond the amorphous silicon material 128 to the electrically insulative material 130. As another non-limiting example, the amorphous silicon material 126 may be bonded to the insulator material 104 by heating the semiconductor structure 140 to a temperature of less than about 600° C., such as from about 300° C. to about 400° C. If the electrically insulative material 130 is formed from silicon dioxide, silicon-oxide bonds may form between the amorphous silicon material 128 and the insulator material 130. Because the back gate electrode 124 may be formed of a metal or other heat sensitive material, the temperature to which the semiconductor structure 140 is exposed may be less than the melting point of the back gate contact 124.

To form the semiconductor structure 140 shown in FIG. 4, the transfer region 150 may be removed from the semiconductive material 142, along the implanted zone shown in FIG. 6. The transfer region 150 may be removed by techniques known in the art, such as by applying a shear force to the implanted zone 152 or by applying heat or a jet gas stream at the implanted zone 152. The atomic species in the implanted zone 152 produce a weakened region in the semiconductive material 142 of the workpiece 146, which is susceptible to cleavage.

The back gate dielectric 126, the back gate contact 124, and the amorphous silicon material 128 and a portion of the semiconductive material 142 below the implanted zone 152 may remain bonded to the electrically insulative material 130 to form the semiconductor structure 140 shown in FIG. 4. After separation of the semiconductive material 142, an exposed surface 154 thereof may be undesirably rough. To remedy this deficiency, the exposed surface 154 of the semiconductive material 142 may be smoothed to a desired degree in order to facilitate further processing as described, according to techniques known in the art, for example, one or more of grinding, wet etching, and CMP.

Figure 7:
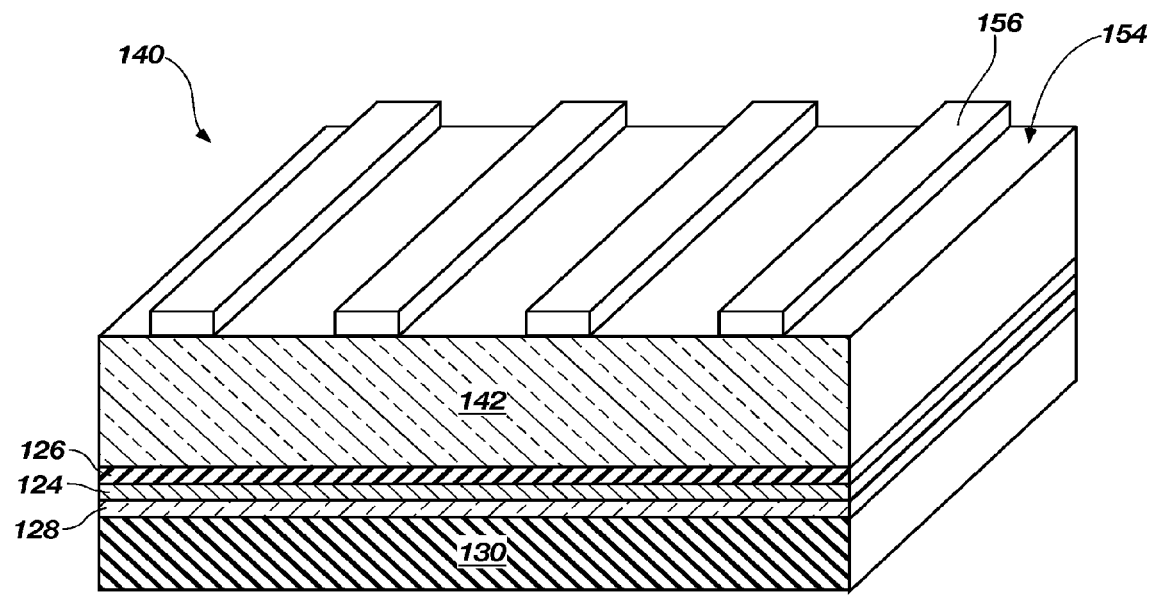

FIG. 7 shows the semiconductor structure 140 of FIG. 4 after a mask material 156 has been deposited on the semiconductive material 142 and patterned to form apertures through which surfaces 154 of the semiconductive material 142 are exposed. The mask material 156 may include, for example, a photoresist material, an oxide material, transparent carbon or amorphous carbon. Methods of forming and patterning the mask material 156 are known in the art and, therefore, are not described in detail herein. For the sake of simplicity, the handle wafer 144 underlying the electrically insulative material 130 has been omitted from the remaining figures.

Figure 8A:
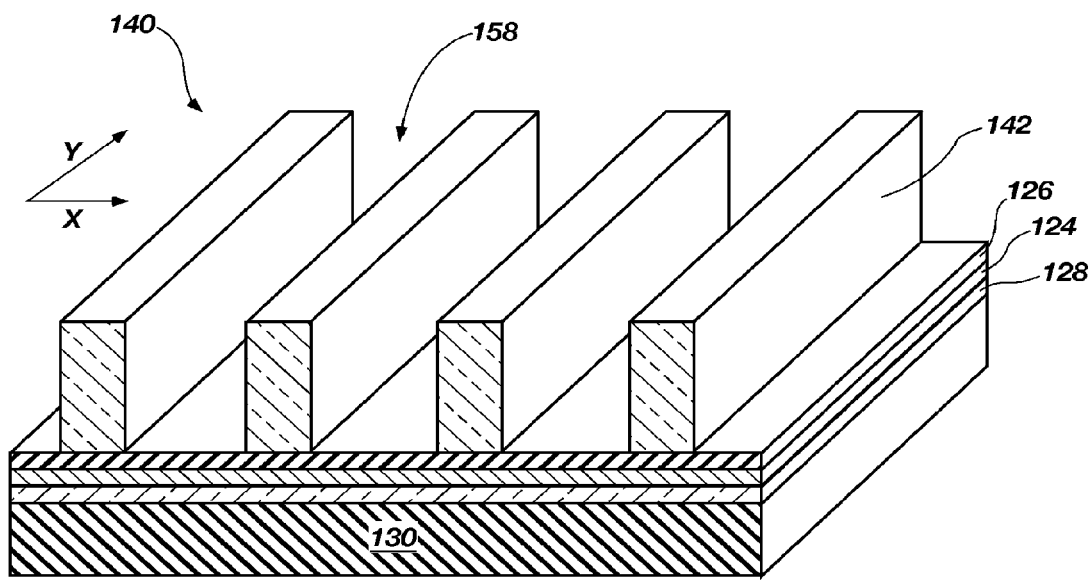
Figure 8B:
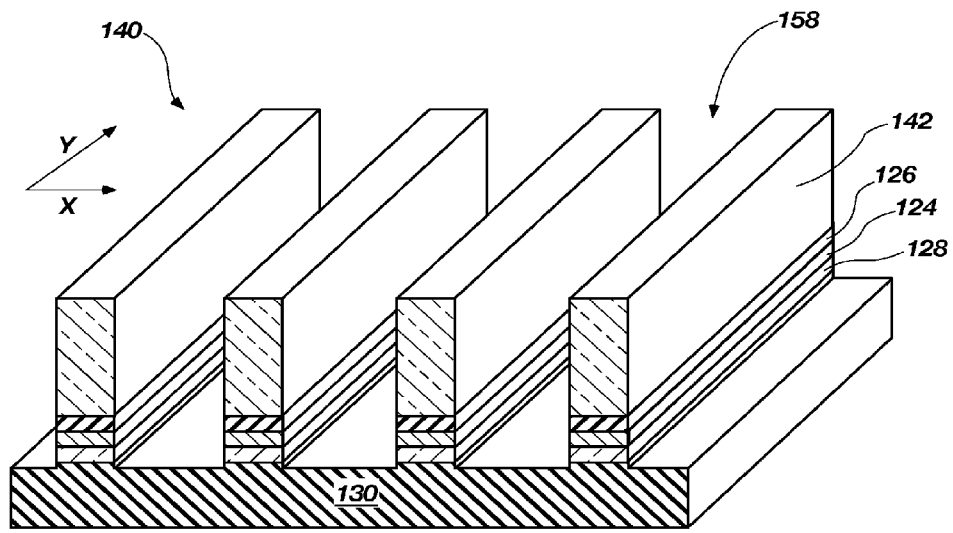

As shown in FIG. 8A, portions of the semiconductive material 142 exposed through the apertures in the mask material 156 may be removed to form trenches 158 between remaining portions of the semiconductive material 142. The remaining portions of the mask material 156 may then be removed. By way of non-limiting example, the trenches 158 may be formed extending through the semiconductive material 142 in the second direction Y. A reactive ion etching (RIE) process to selectively remove the semiconductive material 142 with respect to the mask material 156 and the back gate dielectric 126. In some embodiments, as shown in FIG. 8B, after removing the portions of the semiconductive material 142, portions of each of the back gate dielectric 126, the back gate electrode 124 and the amorphous silicon material 128 may be removed in situ through the same mask material 156, to form an individual or single back gate 123 such as that shown in the floating body cell structure 101 of FIG. 2. FIG. 2 shows continuous 124, 126, 128 portions of the back gate dielectric 126, the back gate electrode 124 and the amorphous silicon material 128 may be removed using, for example, an anisotropic reactive ion (i.e., plasma) etching process, to expose the underlying electrically insulative material 130. For example, if the back gate dielectric 126 is formed from silicon dioxide, a reactive ion etching (RIE) process using a nitrogen trifluoride ($NF_3$)-based gas, a chlorine (Cl)-based gas or a bromide (Br)-based gas may be performed to selectively remove the back gate 123 from the silicon dioxide with respect to the mask material 156. If the back gate electrode 124 is titanium nitride, an anisotropic etching process using a tetrafluoromethane ($CF_4$) gas, a mixture of a bromine-containing gas and a fluorine-containing gas or a mixture of a fluorine-containing gas and a chlorine-containing gas to remove the titanium nitride with respect to the mask material 156. If the amorphous silicon material 128 is amorphous polysilicon, an anisotropic etching process using a mixture of a fluorine-containing gas and a chlorine-containing gas may be used to remove the amorphous silicon material with respect to the mask material 156. In other embodiments, the trenches 158 may be formed using a conventional pitch-doubling process, by techniques known in the art.

Figure 9:
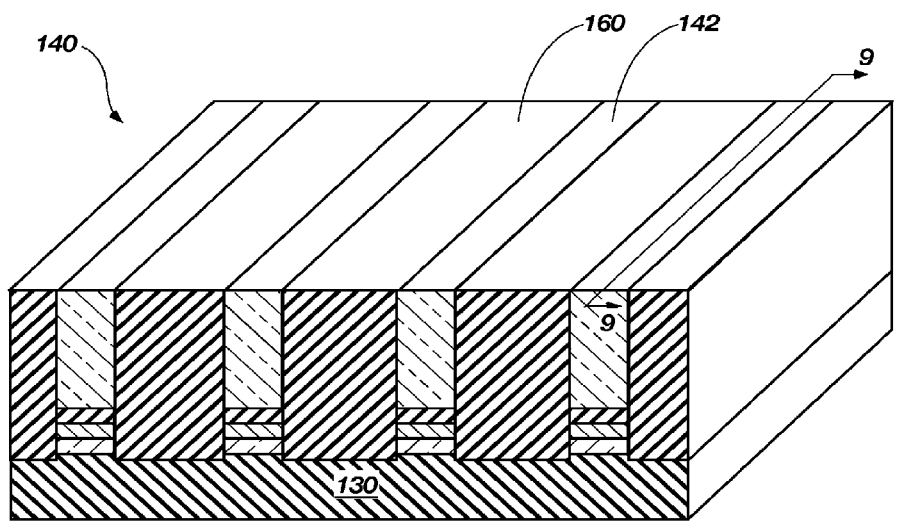
Figure 10:
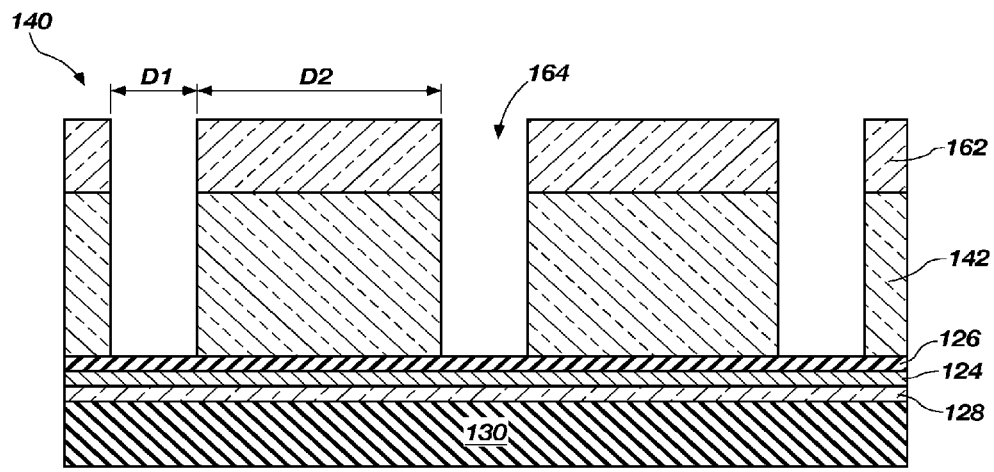

FIG. 9 shows the semiconductor structure 140 after depositing a fill material 160 in the trenches 158. While FIG. 9 shows trenches 158 extending through the back gate dielectric 126, the back gate contact 124, and the amorphous silicon material 128, the channels 128 to be filled may be as shown in FIG. 8A. By way of non-limiting example, the fill material 160 may include a dielectric material such as an oxide material or a nitride material, and may be deposited using a chemical vapor deposition process or a spin-on dielectric process.

FIGS. 10-13 are cross-sectional views of the semiconductor structure 140 shown in FIG. 9, taken along section line 9-9, after a sacrificial mask material 162 has been deposited thereover and a plurality of openings 164 have been formed. The sacrificial mask material 162 may be formed over the semiconductive material 142 and the fill material (not shown) and the plurality of openings 164 may be formed by removing portions of the sacrificial mask material 162 and the semiconductive material 142. Each of the plurality of openings 164 may be formed extending in the second direction Y. As a non-limiting example, the sacrificial mask material 162 may be formed from an amorphous silicon material or a dielectric material using a CVD process. By way of non-limiting example, the openings 164 may be formed by providing a photoresist material (not shown) over the sacrificial mask material 162 and removing portions of the photoresist material overlying regions of sacrificial mask material 162 and the semiconductive material 142 that are to be removed. An anisotropic etching process (e.g., a dry reactive ion or plasma etching process) may then be used to etch the regions of the sacrificial mask material 162 and the semiconductive material 142 exposed through the photoresist material to form openings 164 that expose regions of the sacrificial mask material 162. For example, if the sacrificial mask material 162 and the semiconductive material 142 are formed from polysilicon, a reactive ion etching process using a fluorine (Fl)-based gas may be performed to selectively remove the amorphous silicon material, forming the openings 164 between portions of the semiconductive material 142. As a non-limiting example, the openings 164 may be formed to have a dimension D1 of 0.5 F and the remaining portions of the semiconductive material 142 may have a dimension D2 of 1.5 F. Additionally, the back gates 123, as shown in FIG. 1, may be formed by removing a portion of each of the back gate dielectric 126, the back gate electrode 124 and the amorphous silicon material 128 after removing the semiconductive material 142 such that the openings 164 extend through each of these materials leaving the back gate 123 intact. After forming the openings 164, the remaining photoresist material may be removed using a conventional ashing process. The openings 164 may also be formed using a conventional pitch-doubling process, by techniques known in the art.

Figure 11:
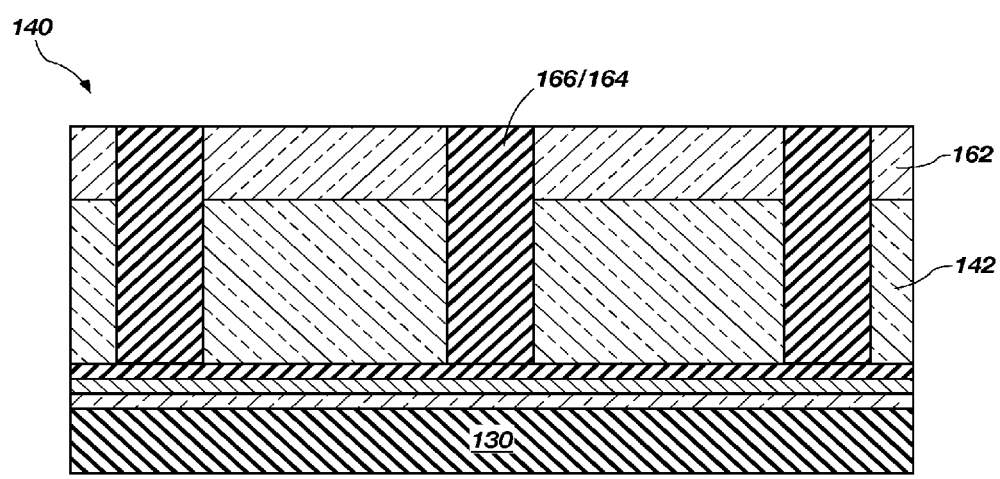

As shown in FIG. 11, another fill material 166 such as an oxide material or a nitride material may be deposited in the openings 164. By way of non-limiting example, the fill material 166 may be deposited using a CVD process, a PECVD process or spin-on dielectric process. Thus, the semiconductive material 142 is completely physically isolated from the surrounding environment.

Figure 12:
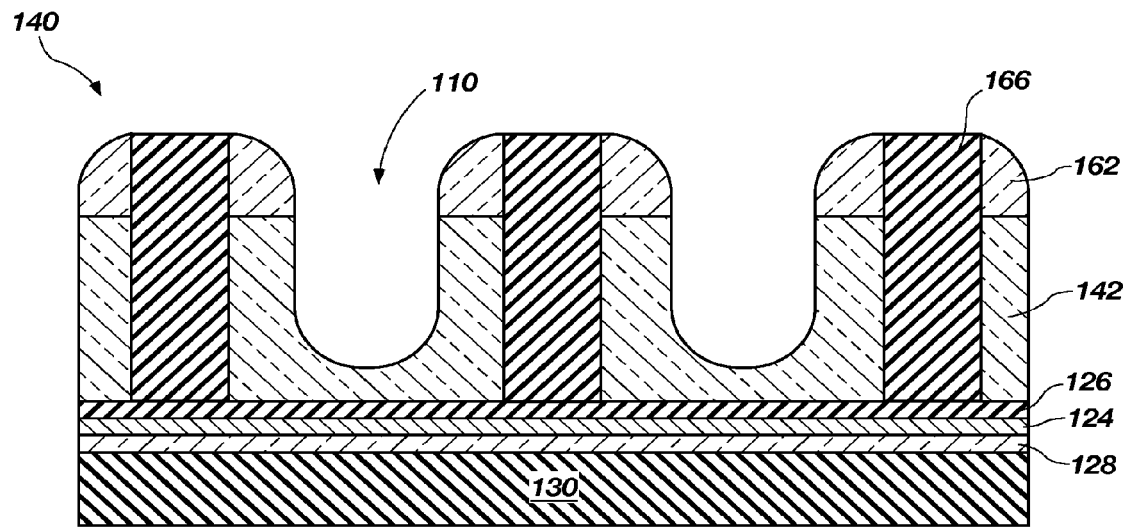

As shown in FIG. 12, a portion of each of the sacrificial material 162 and the semiconductive material 142 may be removed to form the voids 110 in the semiconductive material 142. If the semiconductive material 142 is formed from a crystalline silicon material, a plasma including a mixture of sulfur hexafluoride ($SF_6$) gas, oxygen gas and helium (He) gas, or a mixture of sulfur hexafluoride gas and trifluoromethane ($CHF_3$) gas, may be introduced to the semiconductor structure 140 to form the voids 110. FIG. 11 depicts the voids 110 as having a u-shaped profile; however, voids having various other profiles may also be formed, as will be recognized by one of ordinary skill in the art.

Figure 13:
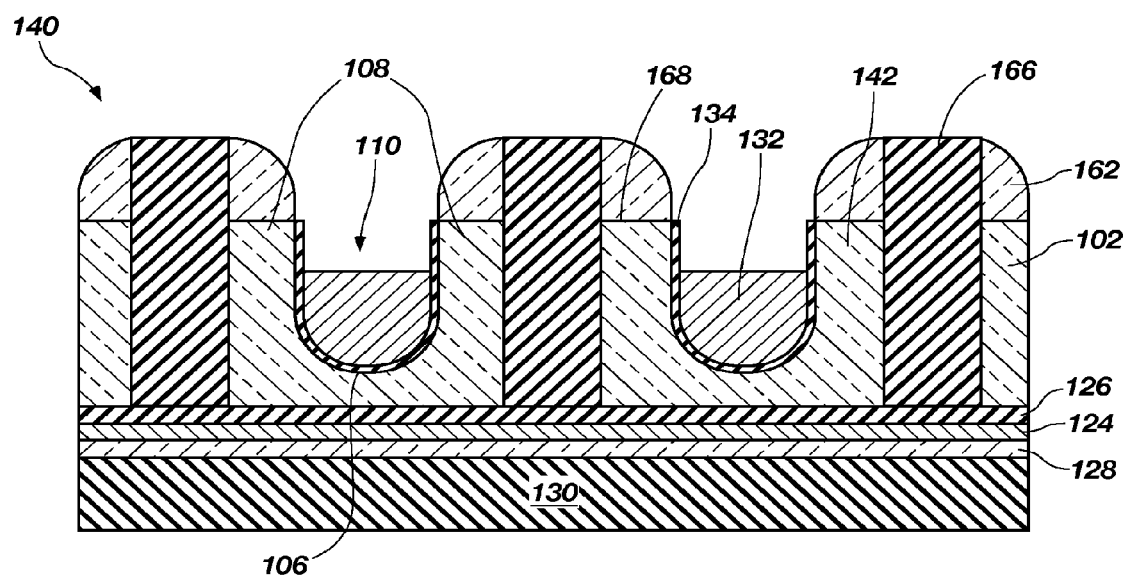

FIG. 13 shows the semiconductor structure 140 after the buried gate electrodes 132 have been formed in each of the voids 110. As a non-limiting example, a CMP process may be used to remove portions of the fill material 166 and the sacrificial material 162 so that an upper surface 168 of the semiconductor structure 140 is substantially planar. The buried gate electrodes 132 may be formed from a conductive material such as, tungsten, titanium nitride or tantalum nitride, and may be deposited using a conventional CVD process, PVD process or ALD process. By way of non-limiting example, the conductive material may be formed over the semiconductor structure 140 and removed after deposition using a conventional CMP process, RIE process or wet etching process to form the buried gate electrodes 132. The buried gate dielectric 134 may be deposited over sidewalls of the semiconductive material 142 exposed in each of the voids 110 before forming the buried gate electrodes 132.

Figure 14:
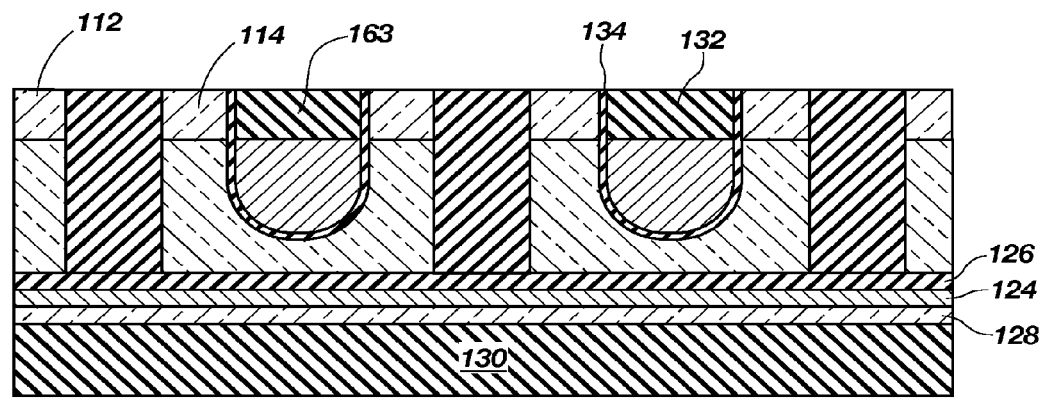

FIG. 14 shows the semiconductor structure 140 after forming the buried gate electrodes 132 in the voids 110 and another fill material 163 thereover. As shown in FIG. 14, source regions 112 and drain regions 114 may be formed in exposed regions of the pillars 108 of the volume of semiconductive material 102. The source regions 112 and drain regions 114 may include a silicon material that is doped with an n-type dopant, such as phosphorous or arsenic, (i.e., n-type silicon material). Exposed portions of the semiconductive material 142 may be doped using conventional methods, such as an ion implantation process or plasma ion process or a high temperature diffusion process. The source regions 112 and the drain regions 114 may be spaced apart from the back gate electrode 124 by the semiconductive material 142. As another example, a thin film of a n-type material (not shown) may be deposited over surfaces of the semiconductor structure 140 and a thermal anneal may be performed during which n-type dopants migrate into the semiconductive material 142 to form n-type silicon for the source regions 112 and drain regions 114. The source regions 112 and drain regions 114 may, optionally, be formed before forming the buried gate electrodes 132.

Referring back to FIGS. 1-3, after forming the source regions 112 and the drain regions 114, the common source lines 116 may be formed over the source regions 112 aligned in each of the rows and the bit lines 118 may be formed over the drain regions 114 aligned in each of the columns. In some embodiments, the common source lines 116 and the bit lines 118 may be formed by depositing a conductive reactive material over the semiconductor structure 100, 101 or 103 and pattering the conductive material to form substantially straight and substantially parallel conductive lines. For example, the common source lines 116 may be formed in the direction X, each of the common sources lines 116 disposed above and substantially parallel to one of the buried gate electrodes 132. The bit lines 118 may be formed extending in the direction Y. Optionally, the contact plug 119 may be formed on at least one of the drain regions 114 and the source regions 112 to elevate that contact before forming the associated common source line 116 or bit line 118. For example, the contact plug 119 may be formed by depositing and patterning a doped amorphous silicon material. Optionally, the contact plug 119 may be replaced by a metal material, such as titanium nitride/tungsten, or the contact plug may be filled with the conductive reactive material during formation of the conductive lines.

Figure 15:
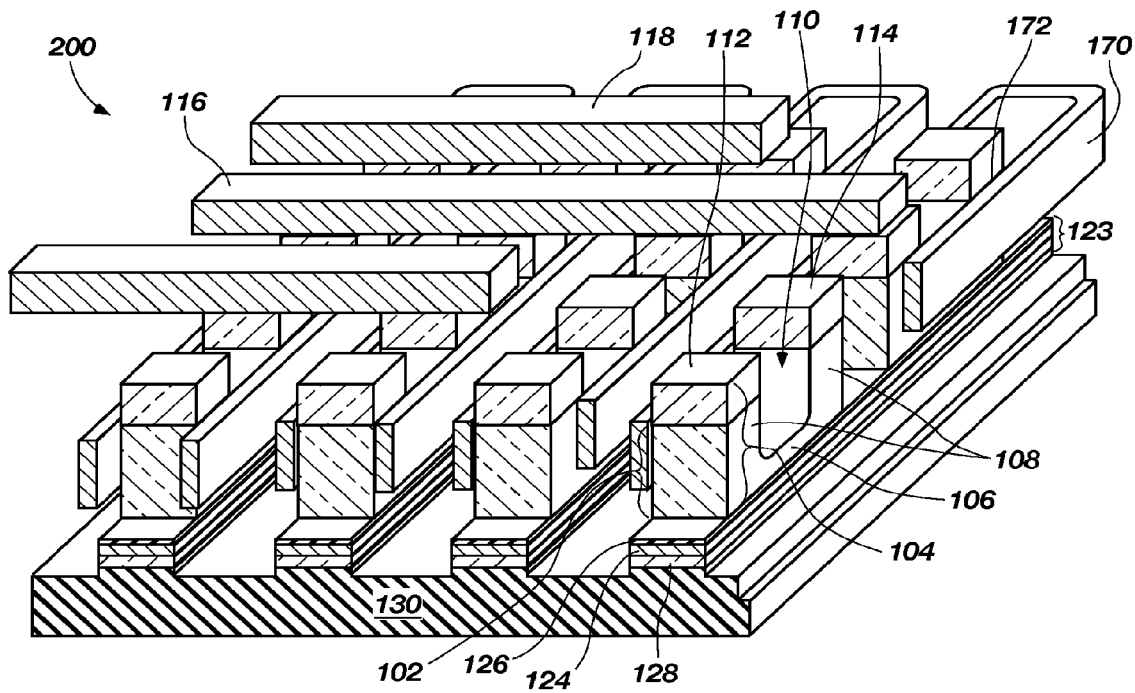
FIG. 15 illustrates a perspective view of a portion of a floating body cell device in accordance with another embodiment of the present disclosure.

FIG. 15 is a perspective view illustrating another embodiment of a floating body cell structure 200 that includes a plurality of floating body cells 104, the details of forming such will be described in detail. For the purposes of illustrating the floating body cells 104, a portion of the gate 170 has been removed, as shown in broken lines. In some embodiments, the floating body cell structure 200 may be used to form a vertical multi-gate floating body cell device. Each floating body cell 104 in the floating body cell structure 200 may include a floating body cell 104 formed from a volume of semiconductive material that includes a channel region 106 extending between pillars 108, which are separated by a void 110, such as, a u-shaped trench, as described with respect to FIGS. 1-3. The source regions 112 and the drain regions 114 may be formed in the upper regions of the pillars 108 and may, respectively, be electrically coupled to an access line, such as common source line 116 and a data/sense line, such as bit line 118. By way of non-limiting example, the common source line 116 and the bit line 118 may, respectively, be formed directly on the source regions 112 and the drain regions 114, as shown in FIG. 15. Additionally, a contact plug 119 may be disposed between the source regions 112 and the associated common source line 116 to elevate the contact or between the drain regions 114 and the associated bit line 118.

The floating body cells 104 may be arranged as described with respect to FIGS. 1-3, wherein the floating body cells 104 are aligned in a plurality of rows in the first direction X and the plurality of columns in the second direction Y substantially perpendicular to the first direction X. FIG. 1 shows the back gate 123 as a local back gate disposed under rows of floating body cells 104 and extending in a direction parallel to floating body cells 104. The sidewalls of the back gate 123 are shown as being continuous and aligned with those of the floating body cells 104. In other embodiments, the back gate 123 may be configured as described with respect to FIGS. 2 and 3.

At least one conductive element 170 may be disposed on opposite vertical surfaces (i.e., sidewalls) of each of the floating body cells 104. For the ease of description, the conductive element 170 is hereinafter referred to as gate 170. Another dielectric material 172 may be disposed between the gate 170 and the sidewalls of the floating body cells 104. For the ease of description, the dielectric material 172 is hereinafter referred to as gate dielectric 172. Each of the floating body cells 104 of the floating body cell structure 200 may be electrically coupled to the back gate 123 and the gates 170 disposed on two sidewalls of the floating body cells 104 so that the floating body cell 104 includes three gates, or may be electrically coupled to the back gate 123 and the gate 170 disposed on a single sidewall of the floating body cells 104 so that the floating body cell 104 includes two gates. Electromagnetic fields emanating from the gates 170 may establish a channel through the associated floating body 104, which enables a current to flow from the source region 112 to the drain region 114.

Figure 16:
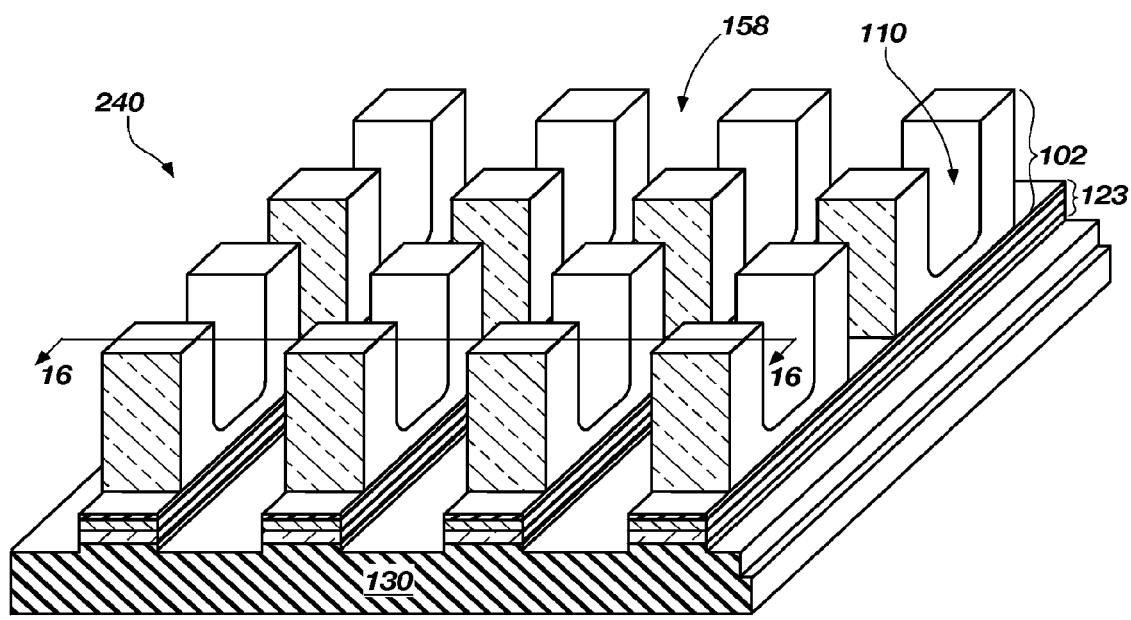

FIGS. 16-20 illustrate embodiments of a method of forming the floating body cell structure 200 shown in FIG. 15. Referring to FIG. 16, a semiconductor structure 240 that includes an array of floating body cells 104, each including a volume of semiconductive material 102 disposed on the back gate 123 may be formed using methods such as those described with respect to FIGS. 4-12. The back gate 123 may include back gate dielectric 126, back gate electrode 124 and amorphous silicon material 128 and may be disposed on an electrically insulative material 130 overlying a wafer (not shown). As previously described, other logic elements (not shown), such as a complementary metal oxide semiconductor structure (CMOS) device, may be formed in or on the wafer. Although the trenches 158 are illustrated as terminating within the electrically insulative material 130, the trenches 158 may, optionally, be formed to terminate on the back gate dielectric 126, such as those described with respect to FIG. 8A.

FIGS. 17A1-17B2 are cross-sectional views of the semiconductor structure 140 shown in FIG. 16, taken along section line 16-16. After forming the trenches 158, the gates 170 may be formed on sidewalls of the floating body cells 104, as described with respect to FIGS. 17A1-17B2. As shown in FIG. 17A1, a gate dielectric material 172 and a conductive material 174 may be formed over semiconductor structure 240. By way of non-limiting example, the gate dielectric material 172 may be an oxide material, a nitride material or a high k dielectric material formed using, for example, a chemical vapor deposition process or a thermal oxidation process. For example, if the gate dielectric material 172 is silicon dioxide, the semiconductor structure 240 may be exposed to an oxygen gas at a temperature of from about 900° C. to about 1175° C. to form the silicon dioxide on sidewalls of the floating body cells 104. The conductive material 174 may then be formed over the gate dielectric material 172. As a non-limiting example, the conductive material 174 may be formed from titanium nitride, tantalum nitride or tungsten and may be deposited using a chemical vapor deposition process. Referring to FIG. 17A2, an anisotropic dry etching process or a wet etching process may be performed to remove portions of the conductive material 174 and the gate dielectric material 172 to form the gates 170.

In other embodiments, the gates 170 may be formed on the sidewalls of the floating body cells 104 as shown with respect to FIGS. 17B1 and 17B2. Referring to FIG. 17B1, after forming the gate dielectric material 172 over the semiconductive material 142, the remaining portions of the trenches 158 between regions of the semiconductive material 142 may be filled with the conductive material 174 and the conductive material 174 may be recessed back to a desired thickness. By way of non-limiting example, the conductive material 174 may be formed from titanium nitride, tantalum nitride or tungsten and may be deposited using a chemical vapor deposition process. Spacers 176 including a dielectric material may be formed on sidewalls of the gate dielectric material 172 above the conductive material 174 using a conventional spacer etching process. Referring to FIG. 17B2, an anisotropic etching process may be performed to remove a portion of the conductive material 174 to form the gates 170. After forming the gates 170, the spacers 176 may be removed using, for example, a conventional selective etching process.

Figure 18A:
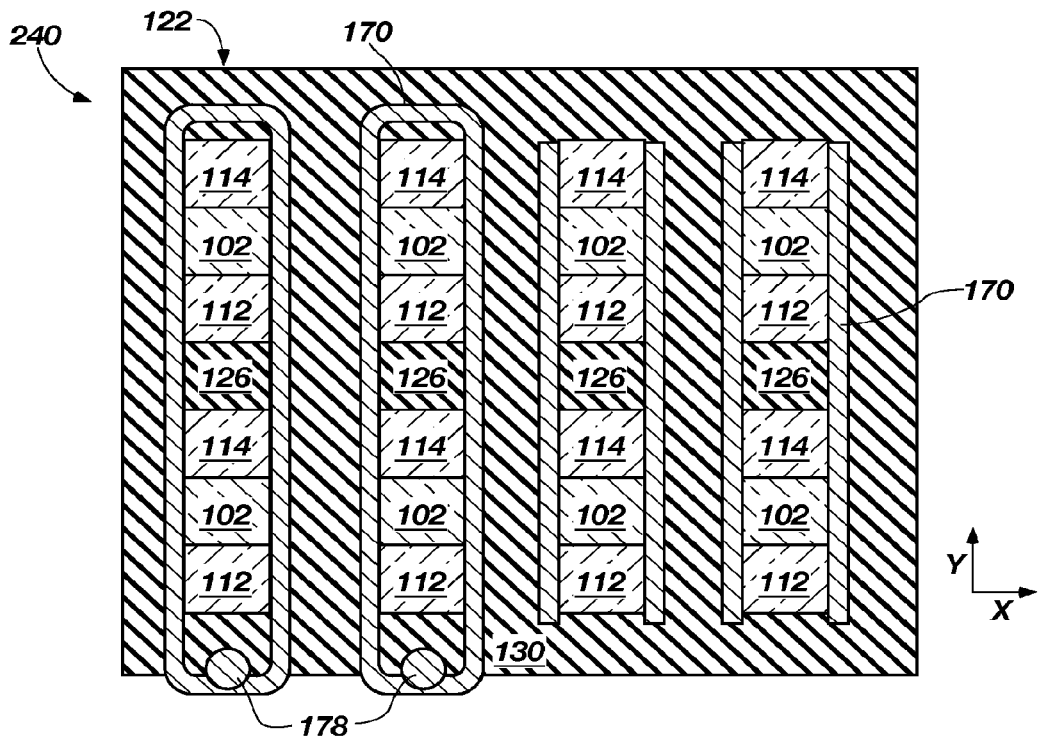
Figure 18B:
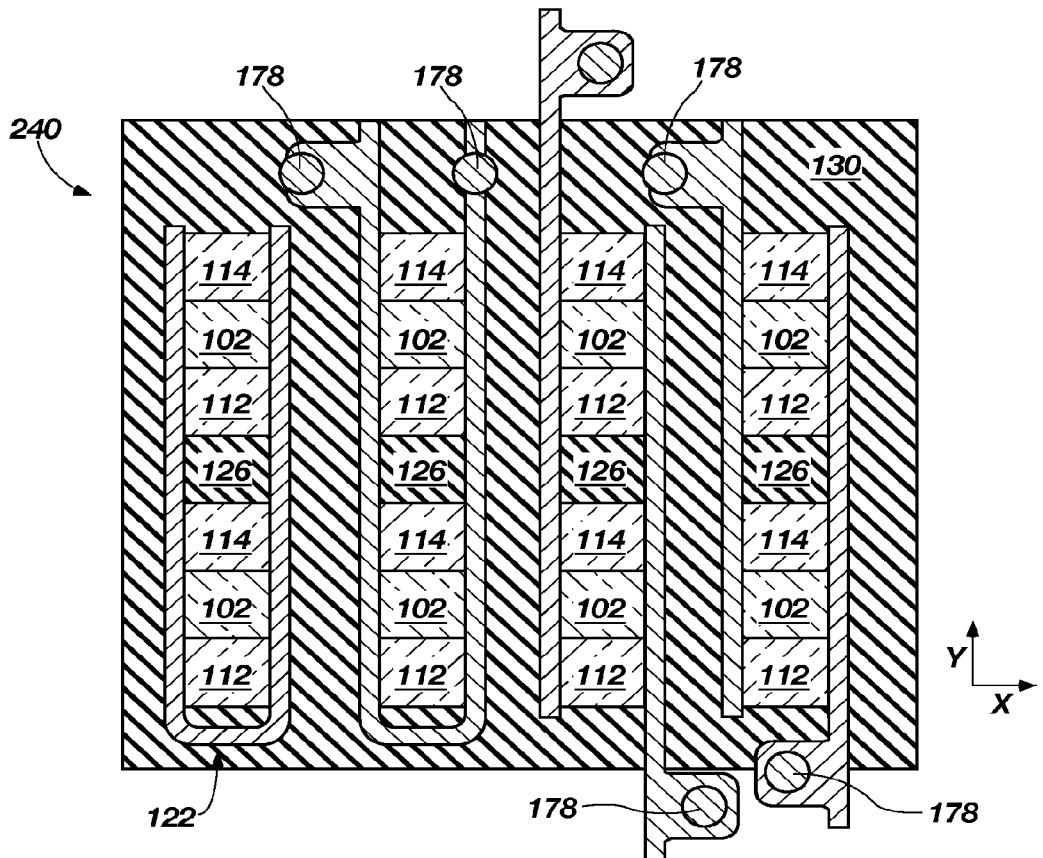

FIGS. 18A and 18B are top down views of the semiconductor structure 240 shown in FIGS. 17A2 and 17B2 illustrating the configuration of the gates 170. The gates 170 may be formed to electrically connect pluralities of the floating body cells 104 with one another. As a non-limiting example, the gates 170 may extend along the columns of floating body cells 104 in direction Y. As shown in FIG. 18A, each of the gates 170 may substantially circumscribe the plurality of floating body cells 104 in a single one of the columns, vertical surfaces (i.e., sidewalls) of each of the floating body cells 104 being contacted by the gate 170. Referring to FIG. 18B, another embodiment is shown wherein the gates 170 are configured in a comb-like structure extending along at least one of the rows in a direction X and terminating at or near an end thereof, each of the gates 170 being disposed on opposite sidewalls of the floating body cells 104 in the row. Contacts 178 may be electrically coupled to each of the gates 170, for example, at a terminal portion thereof, so that the gates 170 are independently connected. Accordingly, as shown in FIGS. 18A and 18B, the gates 170 may be configured to form single-gate, dual-gate and triple-gate floating body cells 104.

Figure 19:
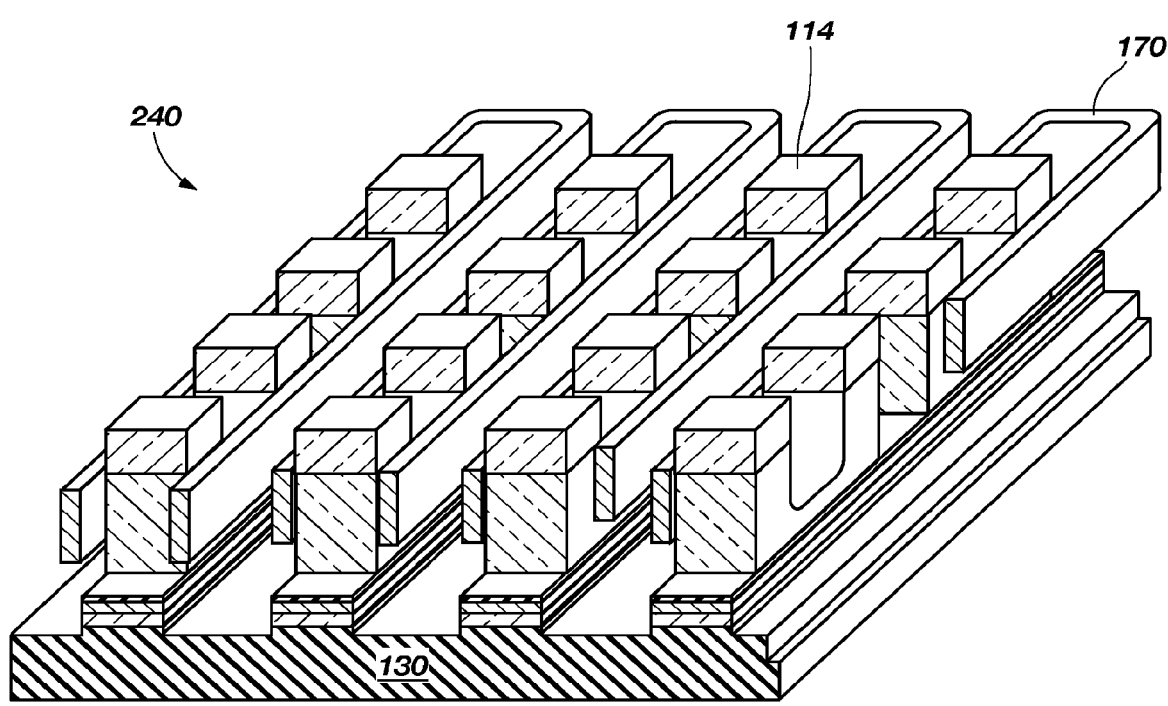

As shown in FIG. 19, after forming the gates 170, source regions 112 and drain regions 114 may be formed in the upper portion of the pillars 108 of floating body cells 104 by exposing the semiconductor structure 240 to an n-type dopant or a p-type dopant, as described with respect to FIG. 14. The common source lines 116 may then be formed over the source regions 112 of the floating body cells 104 and the bit lines 118 may be formed over the drain regions 114 of the floating body cells 104 to form the semiconductor structure 240 shown in FIG. 18. The common source lines 116 and bit lines 118 may be formed by depositing a conductive material and pattering the conductive material to form conductive lines extending in the first direction X, substantially perpendicular to the gates 170. Since the common source lines 116 and bit lines 118 are parallel to another, the common source lines 116 and bit lines 118 may be formed using a conventional damascene process. For example, a sacrificial dielectric material (not shown) may be deposited over the semiconductor structure 240 and a pattern of apertures may be formed therein in locations at which the common source lines 116 and bit lines 118 are to be formed using a conventional lithographic process. A conductive material may be deposited over the semiconductor structure 240 to fill the apertures and a chemical mechanical polishing process may be used to remove a portion of the conductive material overlying the dielectric material to form the common source lines 116 and bit lines 118. Optionally, a doped material (not shown) may be formed on at least one of the source regions 112 and drain regions 114 before forming the associated common source line 116 or bit line 118.

Figure 20:
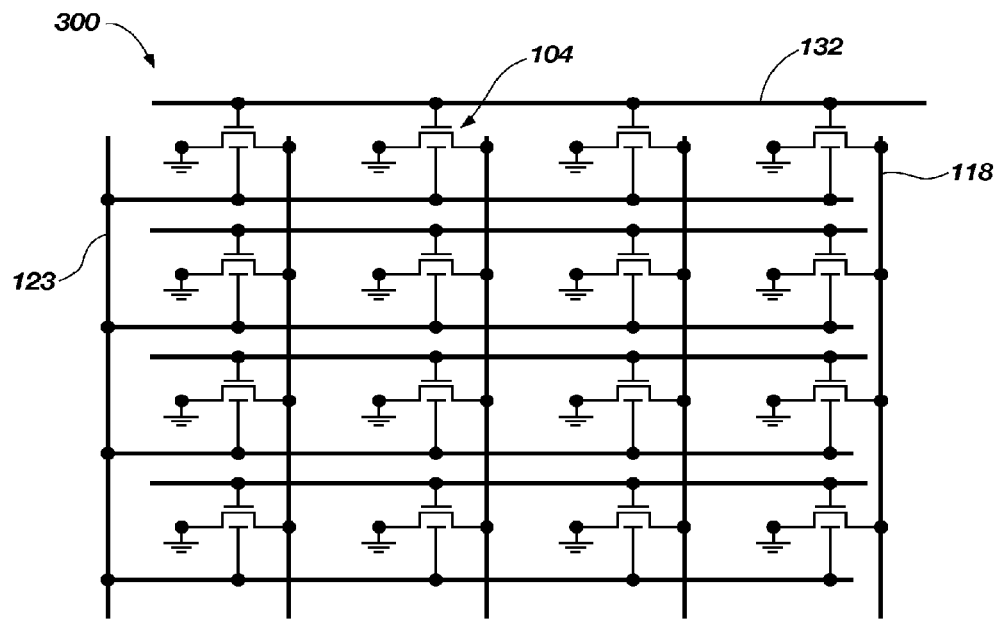
FIGS. 20-22 illustrate electrical circuit diagrams, each representing a portion of a floating body cell device in accordance with embodiments of the present disclosure.
Figure 21:
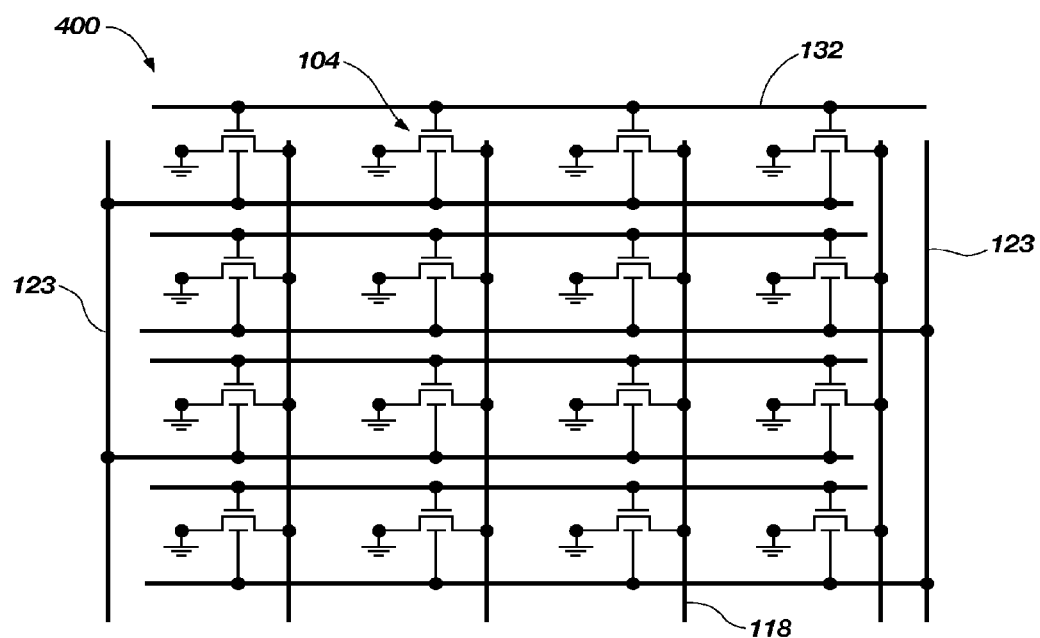
Figure 22:
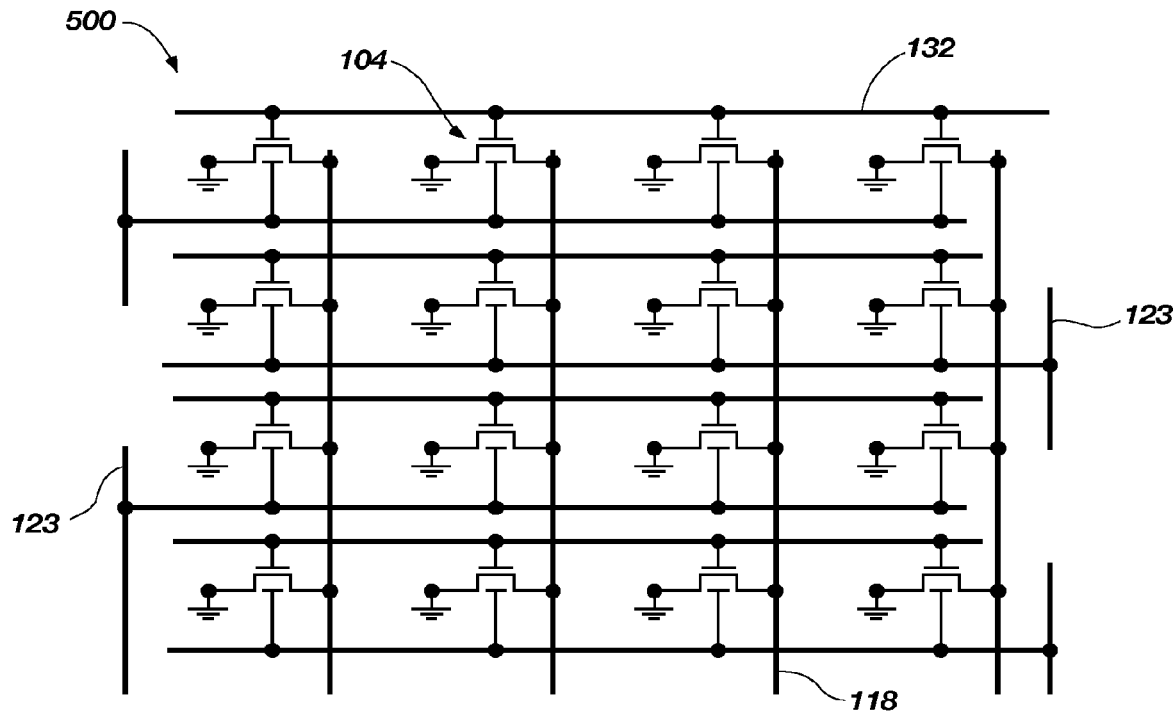

FIGS. 20-22 are electrical circuit diagrams, each of which illustrates a floating body cell structure that includes a plurality of floating body cells, such as those described with respect to FIGS. 1-3 and 15. As shown in FIG. 20, the floating body cell structure 300 may include a plurality of floating body cells 104, each of which is electrically coupled to a gate 132, a bit line 118 and a global back gate 123, such as the back gate 123 shown in FIG. 2. The global back gate 123 and the gate 132 may each be operably coupled to a bias voltage enabling the floating body cells 104 associated with the global back gate 123 to be simultaneously biased.

FIG. 21 illustrates a floating body cell structure 400 including a plurality of floating body cells 104, each of which is electrically coupled to a gate 132, a bit line 118 and a local back gate 123. The local back gates 123 may have a comb-like configuration, such as that shown in FIG. 18B, to provide two distinct addresses for each of the local back gates 123.

FIG. 22 illustrates a floating body cell structure 500 including a plurality of floating body cells 104, each of which is electrically coupled to a gate 132, a bit line 118 and a local back gate 123, such as the back gates 123 shown in FIGS. 2 and 15. Each of the local back gates 123 may be operably coupled to a bias voltage that may be used to individually bias each of the back gates 123.

It should be noted that, during the various stages of fabrication, the floating body cell structures 101, 102 and 103, respectively shown in FIGS. 1 through 3, may be integrated or vertically stacked with other semiconductor structures having a similar structure or with a memory element or device, such as a CMOS device. For example, the CMOS device may be formed over or beneath one of the floating body cell structures 101, 102 or 103 to form a multi-level semiconductor structure, which provides a substantially reduced dies size. The floating body cell structures 101, 102 and 103 may be stacked over another floating body cell structure, memory or logic using, for example, a modification of the so-called SMART-CUT® layer transfer technology as described with respect to FIGS. 4-6.

Figure 23:
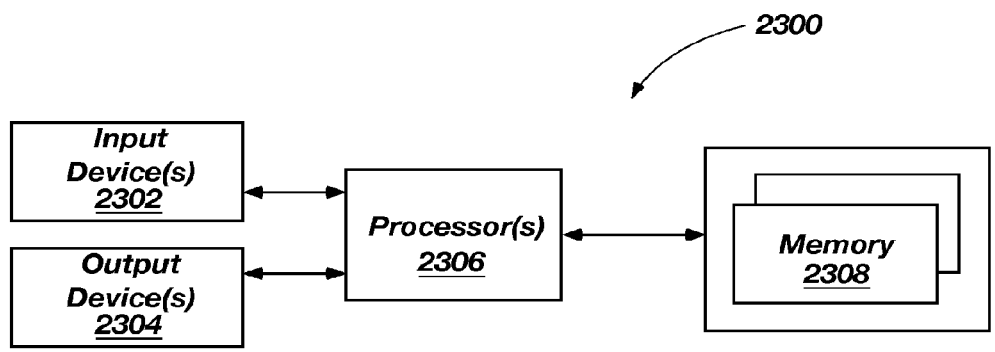
FIG. 23 illustrates a simplified block diagram of a system implemented according to one or more embodiments described herein.

FIG. 23 illustrates a simplified block diagram of an electronic system 2300 implemented according to one or more embodiments described herein. The electronic system 2300 includes at least one input device 2302, at least one output device 2304, a memory access device, such as one or more processors 2306, such as a system-on-chip (SOC), a central processing unit (CPU), processors and the like that may, and one or more memory devices 2308. The memory devices 2308 include at least one embodiment of the devices or methods described herein. The electronic system 2300 may be part of a number of computing, processing, and consumer products. As non-limiting examples, some of these products may include personal computers, handheld devices, cameras, phones, wireless devices, displays, chip sets, set top boxes, games, and vehicles.

CONCLUSION

In some embodiments, the present invention includes floating body cell structures, devices including such structures and method for forming such structures. The floating body cell structures may include a back gate, at least one floating body and another gate associated with the at least one floating body. The at least one floating body may include a semiconductive material and may extend from the back gate to a source region and a drain region. The source region and the drain region may be spaced apart from the back gate by the at least one floating body. The at least one floating body may include a void in the semiconductive material, each of the source region and the drain region disposed opposite the back gate. The another gate may be disposed within the void in the at least one floating body to form a double-gate floating body cell structure or may be disposed on at least one surface of the at least one floating body to form a triple-gate floating body cell structure. A gate dielectric may be disposed between the back gate and the at least one floating body and an amorphous silicon material underlying the back gate and disposed over a wafer. The back gate may be a local back gate comprising sidewalls continuous and aligned with sidewalls of the at least one floating body or a global back gate in which a plurality of floating body cells are disposed in an array. The floating body cell structure may further include a bit line electrically coupled to the back gate and operably coupled to a bias voltage for independently biasing the back gate. The floating body cell structure may further include a common source line electrically coupling the source region of the at least one floating body cell to a source region of at least another floating body and a bit line electrically coupling the drain region of the at least one floating body cell to a drain region of the at least another floating body.

In additional embodiments, the present invention includes a floating body cell device that includes a plurality of floating bodies, each comprising a semiconductive material and extending from a back gate to a source region and a drain region and another gate associated with the plurality of floating bodies and operably coupled to a voltage source and a common source line electrically coupling the source regions of the plurality of floating bodies and a bit line electrically coupling the drain regions of the plurality of floating bodies. The device may be integrated in at least one of a dynamic random access memory, a zero capacitor random access memory, a central processing unit, a system-on-a-chip and embedded dynamic random access memory integrated therewith. The plurality of floating bodies may be aligned in a first direction to form a plurality of rows and a second direction substantially perpendicular to the first direction to form a plurality of columns.

In yet further embodiments, a floating body cell device includes a plurality of floating bodies aligned in a first direction to form a plurality of rows and aligned in a second direction substantially perpendicular to the first direction to form a plurality of columns, at least one back gate associated with the plurality of the floating bodies and at least another gate associated with the plurality of floating bodies and operably coupled to a voltage source. Each of the floating bodies of the plurality of floating bodies may include a volume of semiconductive material having pillars extending from a base portion thereof and separated by a u-shaped trench, an upper portion of each of the pillars comprising a doped region. The at least one back gate may include a conductive material disposed over an amorphous silicon material on an electrically insulative material. The at least another gate may include a conductive material disposed on each of the plurality of floating bodies that may extend, for example, in the first direction, electrically coupling the plurality of floating bodies in at least one of the plurality of rows. The at least another gate may include a conductive material disposed within the u-shaped trench and, for example, may extend in the second direction, electrically coupling the plurality of floating bodies in at least one of the plurality of columns. The at least one back gate may be configured to be biased independent of the another gate. The floating body cell structure may be disposed over and integrated with a memory device, such as a CMOS device, or may be vertically stacked in a number of tiers to increase density.

In yet further embodiments, the present invention includes methods of forming a floating body cell device that include forming a base comprising a semiconductive material, a dielectric material, a gate material, and an amorphous silicon material overlying a wafer, removing a portion of the semiconductive material to form a plurality of floating bodies protruding from a surface of the base, removing another portion of the semiconductive material to form a void in each of the plurality of floating bodies, exposing the plurality of floating bodies to at least one dopant to form a source region and a drain region in upper regions of each of the plurality of floating bodies and forming a gate associated with at least one of the plurality of floating bodies. The base may be formed by forming a donor wafer comprising a dielectric material, a gate material and an amorphous silicon material overlying a crystalline silicon wafer, implanting ions a predetermined depth into the crystalline silicon wafer, attaching the amorphous silicon material of the donor wafer to an electrically insulative material overlying a handle wafer; and separating a portion of the donor wafer to leave a portion of the crystalline silicon wafer so that the dielectric material, the gate material, and the amorphous silicon material overlying a surface of the electrically insulative material of the handle wafer.

In yet further embodiments, the present invention includes a system that includes at least one memory device and at least one floating body cell device operably coupled to the at least one memory device. The at least one floating body cell device may include an array of floating bodies, each of which includes a volume of semiconductive material having pillars extending from a base portion thereof and separated by a u-shaped trench, an upper portion of each of the pillars comprising a doped region, at least one back gate associated with the array of the floating bodies and at least another gate associated with the plurality of floating bodies and operably coupled to a voltage source. The system may include at least one of a central processing unit and a system-on-a-chip. The at least one memory device may include at least one of a dynamic random access memory, a zero capacitor random access memory, and an embedded dynamic random access memory. The at least one memory device and the at least one floating body cell device may be superposed with one another within the system.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method of forming a plurality of floating body cells, comprising:
    forming a base comprising a semiconductive material, a dielectric material, a gate material, and an amorphous silicon material;
    removing a portion of the semiconductive material to form a plurality of floating bodies protruding from the base;
    removing another portion of the semiconductive material to form a void in each of the plurality of floating bodies;
    exposing the plurality of floating bodies to at least one dopant to form a source region and a drain region in upper regions of each of the plurality of floating bodies; and
    forming at least one gate associated with multiple of the plurality of floating bodies.

2. The method of claim 1, wherein forming a base comprising a semiconductive material, a dielectric material, a gate material, and an amorphous silicon material, comprises:
    forming a donor wafer comprising a dielectric material, a gate material and an amorphous silicon material overlying a crystalline silicon wafer;
    implanting ions a predetermined depth into the crystalline silicon wafer;
    attaching the amorphous silicon material of the donor wafer to an electrically insulative material overlying a handle wafer; and
    separating a portion of the donor wafer to leave a portion of the crystalline silicon wafer, the dielectric material, the gate material, and the amorphous silicon material overlying a surface of the electrically insulative material of the handle wafer.

3. The method of claim 1 wherein removing a portion of the semiconductive material to form the plurality of floating bodies protruding from the base further comprises removing a portion of the dielectric material, the gate material and the amorphous silicon material to form the plurality of floating bodies, each floating body disposed on an electrically insulative material overlying the wafer.

4. The method of claim 1 wherein the forming the at least one gate comprises depositing conductive gate material within the void of each of individual of the floating bodies of said multiple of the plurality of floating bodies.

5. The method of claim 1 comprising forming at least two gates associated with said multiple of the plurality of floating bodies.

6. The method of claim 5 wherein forming one of the gates comprises depositing conductive gate material within the void of each of individual of the floating bodies of said multiple of the plurality of floating bodies.

7. The method of claim 5 wherein one of the gates is formed to comprise a front gate and one of the gates is formed to comprise back gate.

8. The method of claim 7 wherein said multiple of the plurality of floating bodies is formed in rows and columns, the back gate comprising back gate lines that are individually formed to be local to an individual row of said multiple of the plurality of floating bodies.

9. The method of claim 7 wherein said multiple of the plurality of floating bodies is formed in rows and columns, the back gate comprising back gate lines that are individually formed to be local to an individual column of said multiple of the plurality of floating bodies.

10. The method of claim 7 wherein said multiple of the plurality of floating bodies is formed in rows and columns, the back gate being formed to be global to said rows and columns.

11. The method of claim 7 wherein the front gate is formed within the void of each of individual of the floating bodies of said multiple of the plurality of floating bodies.

12. The method of claim 7 wherein the front gate is formed on an outer side of each of individual of the floating bodies of said multiple of the plurality of floating bodies.

13. The method of claim 7 wherein the front gate comprises two gates formed on opposing outer sides of each of individual of the floating bodies of said multiple of the plurality of floating bodies.

14. The method of claim 13 wherein the two gates are electrically connected to one another.

15. The method of claim 13 wherein the two gates are not electrically connected to one another.

16. The method of claim 5 comprising forming only two gates associated with said multiple of the plurality of floating bodies.

17. The method of claim 5 comprising forming three gates associated with said multiple of the plurality of floating bodies.

18. A method of forming a plurality of floating body cells, comprising:
    forming a plurality of semiconductor material floating bodies spaced from one another in rows and columns, individual of the floating bodies comprising elevationally extending spaced pillars of the semiconductor material, the spaced pillars of the individual floating bodies being interconnected at their bases by the semiconductor material;
    forming a source/drain region in an elevationally outer region of individual of the pillars;
    forming rows of front gate lines that individually extend along an individual row of the floating bodies between the spaced pillars of individual floating bodies in that row; and
    forming a back gate elevationally under the semiconductor material that interconnects the bases of the spaced pillars.

19. A method of forming a plurality of floating body cells, comprising:
    forming a plurality of semiconductor material floating bodies spaced from one another in rows and columns, individual of the floating bodies comprising elevationally extending spaced pillars of the semiconductor material, the spaced pillars of the individual floating bodies being interconnected at their bases by the semiconductor material;
    forming a source/drain region in an elevationally outer region of individual of the pillars;
    forming columns of front gate lines that individually extend along an outer side of the floating bodies in an individual of the columns of the floating bodies; and
    forming a back gate elevationally under the semiconductor material that interconnects the bases of the spaced pillars.

20. A method of forming a plurality of floating body cells, comprising:
- forming a plurality of semiconductor material floating bodies spaced from one another in rows and columns, individual of the floating bodies comprising elevationally extending spaced pillars of the semiconductor material, the spaced pillars of the individual floating bodies being interconnected at their bases by the semiconductor material;
- forming a source/drain region in an elevationally outer region of individual of the pillars;
- forming pairs of columns of front gate lines that individually extend along opposing outer sides of the floating bodies in an individual of the columns of the floating bodies; and
- forming a back gate elevationally under the semiconductor material that interconnects the bases of the spaced pillars.

21. The method of claim 20 wherein forming the front gate lines comprises:
- depositing conductive gate material to line sidewalls and bases of void space between the columns of floating bodies; and
- etching the conductive gate material to remove at least some of it from being over the bases.

22. The method of claim 20 wherein forming the front gate lines comprises:
- depositing conductive gate material within void space between the columns of floating bodies;
- masking the conductive gate material that is against sidewalls of the void space while leaving a central portion of the gate material laterally between the sidewalls outwardly exposed; and
- etching the central portion of the conductive gate material while the conductive gate material against the sidewalls of the void space is masked.

23. The method of claim 20 wherein forming the front gate lines comprises:
- depositing conductive gate material within void space between the columns of floating bodies;
- forming anisotropically etched sidewall spacers elevationally over the conductive gate material that is against sidewalls of the void space; and
- etching a central portion of the conductive gate material between the spacers while using the spacers as an etch mask.

* * * * *